(12) United States Patent
Kang et al.

(10) Patent No.: US 11,889,646 B2
(45) Date of Patent: Jan. 30, 2024

(54) DISPLAY DEVICE

(71) Applicant: LG ELECTRONICS INC., Seoul (KR)

(72) Inventors: Seunggyu Kang, Seoul (KR); Jaeuk Ryu, Seoul (KR); Youngwook Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 101 days.

(21) Appl. No.: 17/362,844

(22) Filed: Jun. 29, 2021

(65) Prior Publication Data

US 2022/0117103 A1  Apr. 14, 2022

(30) Foreign Application Priority Data

Oct. 12, 2020 (KR) .......................... 10-2020-0131273

(51) Int. Cl.
*H05K 5/02* (2006.01)
*F16M 11/12* (2006.01)
(Continued)

(52) U.S. Cl.
CPC ......... *H05K 5/0234* (2013.01); *F16M 11/105* (2013.01); *F16M 11/125* (2013.01);
(Continued)

(58) Field of Classification Search
CPC .... H05K 5/0234; F16M 11/125; F16M 11/18; F16M 11/105; G06F 1/1681
See application file for complete search history.

(56) References Cited

U.S. PATENT DOCUMENTS 7,506,850 B2 *  3/2009  Chang ................ F16M 11/2021
                                                  248/221.11
7,643,276 B2 *  1/2010  Shin ................... F16M 11/2064
                                                  361/679.06
(Continued)

FOREIGN PATENT DOCUMENTS

KR  1020070084650  8/2007
KR  102143083     8/2020

OTHER PUBLICATIONS

Korean Intellectual Property Office Application No. 10-2020-0131273, Office Action dated Nov. 26, 2021, 5 pages.

*Primary Examiner* — Nidhi Thaker
(74) *Attorney, Agent, or Firm* — LEE, HONG, DEGERMAN, KANG & WAIMEY

(57) ABSTRACT

A display device includes a head including a display panel, a stand supporting the head, and a moving assembly coupled to the head and to the stand, the moving assembly including a rotational assembly for rotating the head and a tilt assembly for allowing the head to be inclined, the rotational assembly includes a base and a rotating plate rotatably disposed at the base, the tilt assembly includes a holder fixed to the stand, a rotating body coupled to the base and rotatably coupled to the holder, the rotating body having a rotational axis intersecting a rotational axis of the rotating plate, and an elastic member disposed between the holder and the rotating body, wherein a first end of the elastic member is coupled to the holder, and wherein the rotating body is supported by the elastic member at a position adjacent to a second end of the elastic member.

15 Claims, 25 Drawing Sheets

(51) Int. Cl.
- *F16M 11/18* (2006.01)
- *F16M 11/10* (2006.01)
- *G06F 1/16* (2006.01)
- *F16M 11/22* (2006.01)
- *G02F 1/1333* (2006.01)
- *H10K 50/84* (2023.01)

(52) U.S. Cl.
CPC ............ *F16M 11/18* (2013.01); *F16M 11/22* (2013.01); *G06F 1/1681* (2013.01); *G02F 1/133308* (2013.01); *H10K 50/84* (2023.02)

(56) References Cited

U.S. PATENT DOCUMENTS

| | | | |
|---|---|---|---|
| 7,712,711 B2* | 5/2010 | Jang | F16M 11/105 |
| | | | 248/371 |
| 8,523,131 B2* | 9/2013 | Derry | F16M 11/18 |
| | | | 16/338 |
| 10,746,347 B2* | 8/2020 | Li | H05K 5/0017 |
| 11,086,369 B2* | 8/2021 | Park | F16M 11/105 |
| 2007/0195495 A1* | 8/2007 | Kim | F16M 11/105 |
| | | | 248/920 |
| 2017/0051866 A1* | 2/2017 | Chen | F16M 11/2014 |
| 2018/0094766 A1* | 4/2018 | Yoon | F16M 11/2014 |
| 2019/0154192 A1* | 5/2019 | Yeh | F16M 11/18 |
| 2019/0316729 A1* | 10/2019 | Gurr | F16F 15/10 |
| 2020/0081483 A1* | 3/2020 | Laurent | F16M 11/10 |

\* cited by examiner

DISPLAY DEVICE

CROSS-REFERENCE TO RELATED APPLICATION

Pursuant to 35 U.S.C. § 119(a), this application claims the benefit of earlier filing date and right of priority to Korean Patent Application No. 10-2020-0131273, filed on Oct. 12, 2020, the contents of which are all hereby incorporated by reference herein in their entirety.

BACKGROUND OF THE INVENTION

1. Field of the Invention

The present disclosure relates to a display device.

2. Description of the Related Art

With the development of information society, demand for various kinds of display devices is increasing. In response to this demand, various kinds of display devices, such as LCDs (Liquid Crystal Display Devices), PDPs (Plasma Display Panels), ELDs (Electro-luminescent Displays), VFDs (Vacuum Fluorescent Displays) and OLEDs (Organic Light-Emitting Diodes) have been recently researched and used.

Among these, an LCD panel includes a TFT substrate and a color substrate, which face each other with a liquid crystal layer interposed therebetween, in order to display an image using light supplied from a backlight unit. Meanwhile, an OLED panel is configured to display an image by depositing a self-luminescent organic layer on a substrate having a transparent electrode formed thereon.

In recent years, structural features of a display device including a stand have been intensively conducted.

SUMMARY OF THE INVENTION

Therefore, the present disclosure has been made in view of the above problems, and it is an object of the present disclosure to provide a display device having a rotating structure for a display device.

Another object of the present disclosure is to provide a tilting structure for a display device.

A further object of the present disclosure is to provide a structure capable of independently realizing rotation and tilting of a display device.

In accordance with an aspect of the present disclosure, the above and other objects can be accomplished by the provision of a display device including a display device including a head including a display panel, a stand supporting the head, and a moving assembly coupled to the head and to the stand, wherein the moving assembly includes a rotational assembly for rotating the head with respect to the stand and a tilt assembly for allowing the head to be inclined with respect to the stand, wherein the rotational assembly includes a base and a rotating plate rotatably disposed at the base about a first rotational axis, wherein the tilt assembly includes a holder fixed to the stand, a rotating body coupled to the base and rotatably coupled to the holder about a second rotational axis, wherein the first rotational axis intersects the second rotational axis, and an elastic member disposed between the holder and the rotating body, wherein a first end of the elastic member is coupled to the holder, and wherein the rotating body is supported by the elastic member at a position adjacent to a second end of the elastic member.

The rotating plate may be coupled to the head at a rear side of the head, the holder may be positioned behind the base, and the rotating body may be positioned between the base and the holder.

The display device may further include a rod extending in a lateral direction and providing the second rotational axis of the rotating body, the holder may include a body coupled to the stand, a first wing angled in a forward direction from the body, and a second wing angled in a forward direction from the body, wherein the second wing is spaced apart from the first wing with respect to the lateral direction, and the rod may extend through the first wing and the second wing.

The rotating body may include a plate coupled to the base, and a connector coupled to the plate at a rear side of the plate, wherein the connector is rotatably coupled to the first wing and the second wing.

The connector may include a first part coupled to the plate, a second part bent in a backward direction from the first part to contact the first wing, a third part bent in the backward direction from the first part to contact the second wing, and a fourth part bent in the backward direction from the first part and to be positioned between the second part and the third part, and the rod may extend through the second part and the third part.

The second end of the elastic member may correspond to an unobstructed end, and the fourth part may include a recess depressed in a forward direction from a rear side of the fourth part and is supported by the elastic member at a position adjacent to the unobstructed end.

The elastic member may include a plurality of elastic members each spaced apart from each other in the lateral direction, and at least one of the plurality of elastic members may be supported by the fourth part at a right end or left end of the recess.

The display device may further include a sleeve around an outer circumferential surface of the rod, and the elastic member may correspond to a spring, and may be wound around an outer circumferential surface of the sleeve.

The display device may further include a bracket coupled to the body and the stand, and the second part and the third part may be spaced apart in the forward direction from the bracket by a predetermined distance.

An outer surface of the first wing may be in contact with an inner surface of the second part, the connector may further include an engagement recess depressed in an upward direction from a lower side of the second part, the holder may further include a stopper projecting outwards from the outer surface of the first wing, and the engagement recess may be spaced apart from the stopper and may surround a portion of the stopper.

The stopper may be positioned on a rotational path of the engagement recess and limits a rotation of the engagement recess and the connector.

The rotational assembly may further include a guide slot, formed in the rotating plate for defining an arc relative to the first rotational axis of the rotating plate, and a slot pin formed on the base and is disposed in the guide slot.

The rotating plate may be configured to have a disc shape, and includes a drive gear formed along an outer circumferential surface of the rotating plate, the guide slot may include a first guide slot positioned opposite to the drive gear with respect to a rotational center of the rotating plate and is formed through the rotating plate, and the slot pin may include a first slot pin projecting from the base and disposed in the first guide slot.

The guide slot may further include a second guide slot positioned opposite to the first guide slot with respect to the rotational center of the rotating plate and is positioned adjacent to the drive gear, and the slot pin may further include a second slot pin projecting from the base and disposed in the second guide slot.

An arc defined by the drive gear may at least partially overlap an arc defined by the second guide slot.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
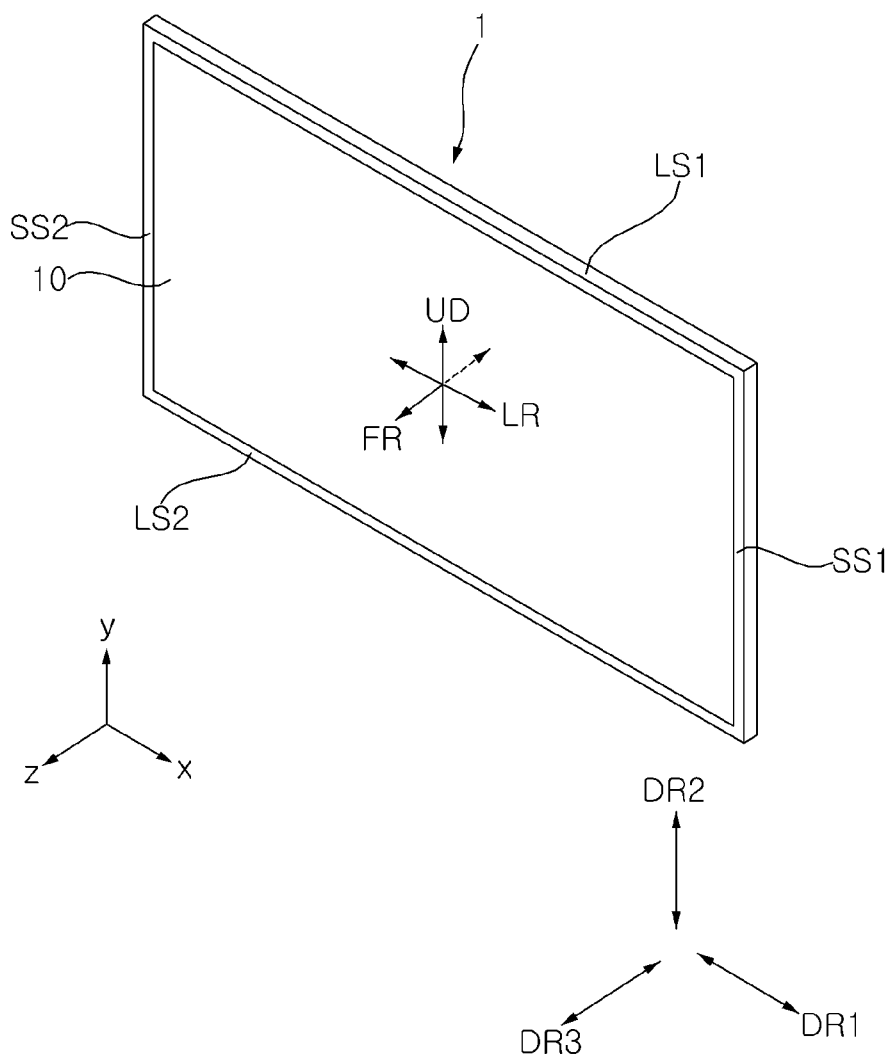
FIGS. 1 to 25 are views illustrating display devices according to embodiments of the present disclosure.

A description will now be given in detail according to exemplary embodiments disclosed herein, with reference to the accompanying drawings. For the sake of brevity of description with reference to the drawings, the same or equivalent components are denoted by the same reference numbers, and a description thereof will not be repeated.

In general, suffixes such as "module" and "unit" may be used to refer to elements or components. The use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to facilitate understanding of various technical features, and it should be understood that the embodiments presented herein are not limited by the accompanying drawings. As such, the present disclosure should be construed to extend to any alterations, equivalents and substitutes, in addition to those that are particularly set out in the accompanying drawings.

It is to be understood that, although the terms "first," "second," etc. may be used herein to describe various elements, these elements should not be limited by these terms. These terms are only used to distinguish one element from another.

It will be understood that when an element is referred to as being "connected with" another element, intervening elements may be present. In contrast, it will be understood that when an element is referred to as being "directly connected with" another element, there are no intervening elements present.

A singular representation may include a plural representation unless the context clearly indicates otherwise.

In the following description, when an example is described with reference to a specific figure, a reference numeral that is not illustrated in the specific figure may be mentioned. The reference numeral that is not illustrated with the specific figure is used in the case in which the reference numeral appears in other figures.

Referring to FIG. 1, the display device 1 may include a display panel 10. The display panel 10 may display a screen.

The display device 1 may include a first long side LS1, a second long side LS2, which faces the first long side LS1, a first short side SS1 adjacent to the first long side LS1 and the second long side LS2, and a second short side SS2, which faces the first short side SS1. Although each of the first and second long sides LS1 and LS2 is illustrated and described as being longer than each of the first and second short sides SS1 and SS2 for convenience of explanation, the length of each of the first and second long sides LS1 and LS2 may be almost the same as that of each of the first and second short sides SS1 and SS2.

A direction parallel to the first and second long sides LS1 and LS2 of the display device 1 may be referred to as a first direction DR1 or a lateral direction LR. A direction parallel to the first and second short sides SS1 and SS2 of the display device 1 may be referred to as a second direction DR2 or a vertical direction UD. A direction perpendicular to the first and second long sides LS1 and LS2 and the first and second short sides SS1 and SS2 of the display device 1 may be referred to as a third direction DR3 or an anteroposterior direction FR. Here, the direction in which the display panel 10 displays an image may be referred to as a forward direction, and the direction opposite the forward direction may be referred to as a rearward direction.

When the display device 1 is rotated 90 degrees (see FIGS. 6 and 7), a direction parallel to the first and second long sides LS1 and LS2 of the display device 1 may be referred to as a second direction DR2 or a vertical direction UD, and a direction parallel to the first and second short sides SS1 and SS2 of the display device 1 may be referred to as a first direction DR1 or a lateral direction LR.

Hereinafter, the display device 1 including an LCD panel as the display panel 10 will be described as an embodiment with reference to FIGS. 2 to 4, and a display device 1' including an OLED panel as the display panel 10' will be described as another embodiment with reference to FIG. 5. However, the display device applicable to the disclosure is not limited thereto.

Figure 2:
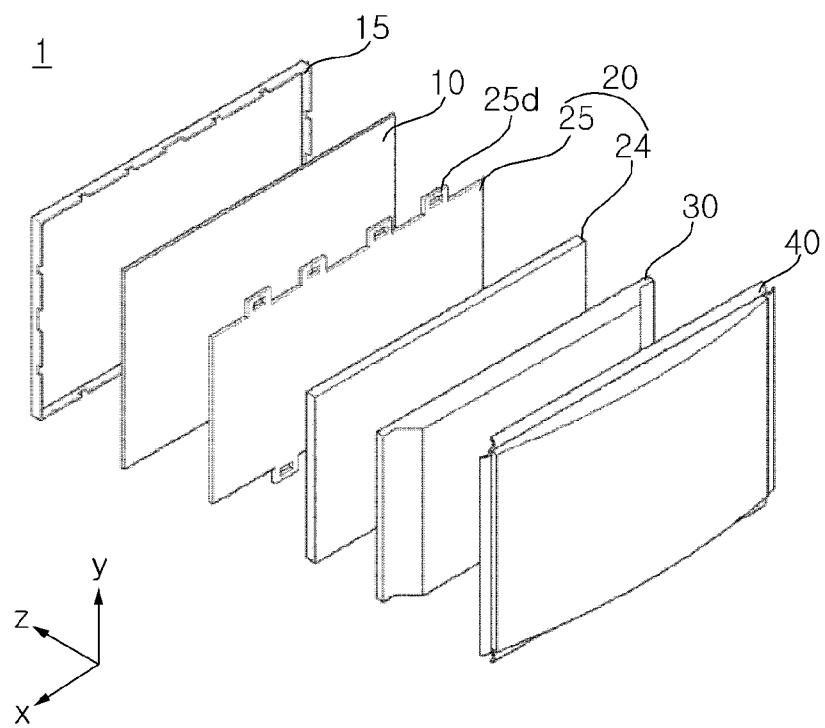

Referring to FIG. 2, the display device 1 may include the display panel 10, a front cover 15, a backlight unit 20, a frame 30, and a back cover 40. Here, the display panel 10 may be referred to as an LCD panel.

The front cover 15 may cover at least a portion of the front surface and the lateral side surface of the display panel 10. The front cover 15 may be divided into a front cover, positioned at the front face of the display panel 10, and a side cover, positioned at the lateral side surface of the display panel 10. The front cover and the side cover may be constructed separately. One of the front cover and the side cover may be omitted.

The display panel 10 is provided on the front face of the display device 1 so as to display an image. The display panel 10 may display an image by outputting red, green or blue of each of a plurality of pixels at specific times. The display panel 10 may be divided into an active area, in which an image is displayed, and an inactive area, in which an image is not displayed. The display panel 10 may include a front substrate and a rear substrate, which face each other with a liquid crystal layer interposed therebetween.

The front substrate may include a plurality of pixels, each of which is composed of red, green and blue sub-pixels. The front substrate may output light corresponding to red, green or blue in response to a control signal.

The rear substrate may include switching devices. The rear substrate may switch a pixel electrode. For example, the pixel electrode may change the molecular arrangement of the liquid crystal layer in response to a control signal. The liquid crystal layer may include liquid crystal molecules. The arrangement of the liquid crystal molecules may be changed according to the voltage difference between the pixel electrode and the common electrode. The liquid crystal layer may transmit the light supplied from the backlight unit 20 to the front substrate, or may obstruct the transmission of light.

The backlight unit 20 may be positioned behind the display panel 10. The backlight unit 20 may include light sources. The backlight unit 20 may be positioned in the front of the frame 30, and may be coupled to the frame 30. The backlight unit 20 may be driven in a whole area driving manner or in a local area driving manner, such as local dimming driving or impulse driving. The backlight unit 20 may include an optical sheet 25 and an optical layer 24.

The optical sheet 25 may enable the light from the light sources to be uniformly transmitted to the display panel 10. The optical sheet 25 may be composed of a plurality of layers. For example, the optical sheet 25 may include a prism sheet, a diffusion sheet and the like.

The optical sheet 25 may include couplers 25d. The couplers 25d may be coupled to the front cover 15, the frame 30 and/or the back cover 40. The couplers 25d may be coupled to a structural object formed on or coupled to the front cover 15, the frame 30 and/or the back cover 40.

The frame 30 may be positioned behind the display panel 10 so as to support the components of the display device 1. For example, components such as the backlight unit 20 and a printed circuit board (PCB), on which a plurality of electronic components are positioned, may be coupled to the frame 30. The frame 30 may include a metal material such as an aluminum alloy. Meanwhile, the frame 30 may be referred to as a main frame or a module cover.

The back cover 40 may be positioned behind the display device 1. The back cover 40 may cover the rear surface of the display panel 10. The back cover 40 may be coupled to the frame 30 and/or the front cover 15. For example, the back cover 40 may be injection-molded from resin. However, the back cover 40 may also include a metal material.

Figure 3:
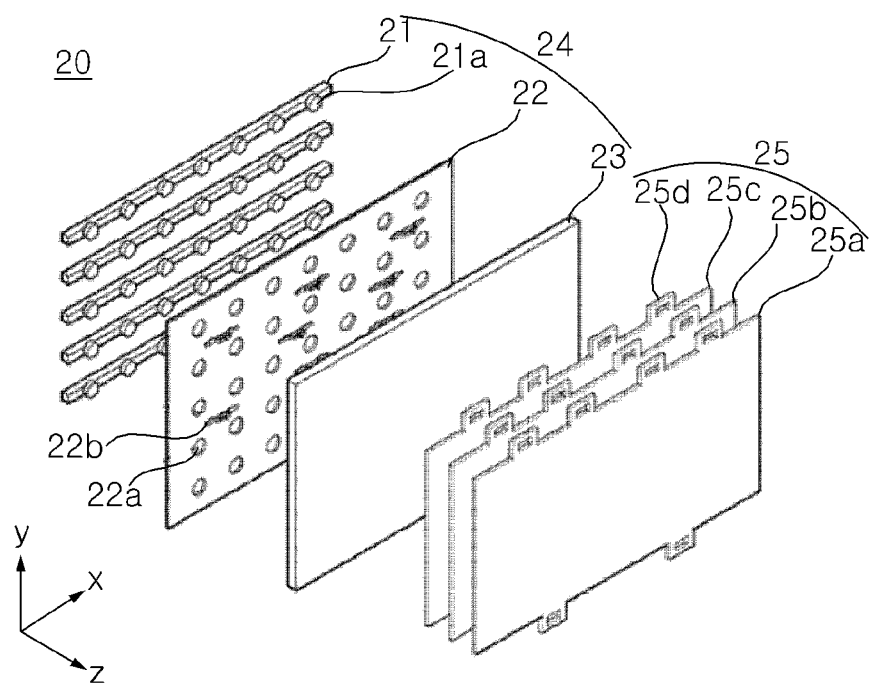

Referring to FIG. 3, the backlight unit 20 may include the optical layer 24, which is composed of a substrate 21, at least one light assembly 21a, a reflective sheet 22 and a diffusion plate 23, and the optical sheet 25 positioned in front of the optical layer 24.

The substrate 21 may be composed of a plurality of straps, which extend in a lateral direction and are spaced apart from each other in a vertical direction. At least one light assembly 21a may be mounted on the substrate 21. An electrode pattern may be formed on the substrate 21 so as to allow an adapter and the light assembly 21a to be connected to the substrate 21. For example, a carbon nanotube electrode pattern may be formed on the substrate 21 so as to allow the light assembly 21a and an adapter to be connected to the substrate 21.

The substrate 21 may be composed of at least one of polyethylene terephthalate (PET), polycarbonate (PC) and silicon. The substrate 21 may be a printed circuit board (PCB), on which at least one light assembly 21a is mounted.

The light assembly 21a may be a light-emitting diode (LED) chip or a light-emitting diode package including at least one light-emitting diode chip. The light assembly 21a may be composed of a colored LED configured to emit at least one color among red, green and blue or a white color LED. The colored LED may include at least one of a red LED, a green LED and a blue LED.

The reflective sheet 22 may be positioned in front of the substrate 21. The reflective sheet 22 may have a plurality of through holes 22a in which the light assemblies 21a are positioned. The reflective sheet 22 may reflect the light, which is emitted from the light assemblies 21a or is reflected by the diffusion plate 23, forwards. For example, the reflective sheet 22 may include metal and/or metal oxide having high reflectance, such as aluminum (Al), silver (Ag), gold (Au) or titanium dioxide ($TiO_2$).

An air gap may be formed between the reflective sheet 22 and the diffusion plate 23. The air gap may serve as a buffer configured to diffuse the light emitted from the light assemblies 21a over a wider region. In order to form the air gap, supports 22b may be positioned between the reflective sheet 22 and the diffusion plate 23.

The diffusion plate 23 may be positioned ahead of the reflective sheet 22. The diffusion plate 23 may be positioned between the reflective sheet 22 and the optical sheet 25.

The optical sheet 25 may include at least one sheet. Specifically, the optical sheet 25 may include at least one prism sheet and/or at least one diffusion sheet. The plurality of sheets included in the optical sheet 25 may be adhered to and/or in close contact with each other.

The optical sheet 25 may be composed of sheets having different functions. For example, the optical sheet 25 may include a first optical sheet 25a, a second optical sheet 25b, and a third optical sheet 25c. For example, the first optical sheet 25a may be a diffusion sheet, and each of the second and third optical sheets 25b and 25c may be a prism sheet. The number and/or positions of the diffusion sheet and the prism sheets may be changed. The diffusion sheet may prevent the light that is emitted from the diffusion plate 23 from being locally concentrated, thereby offering uniform distribution of light. The prism sheets may collect the light emitted from the diffusion plate 23 and transmit the light to the display panel 10.

Figure 4:
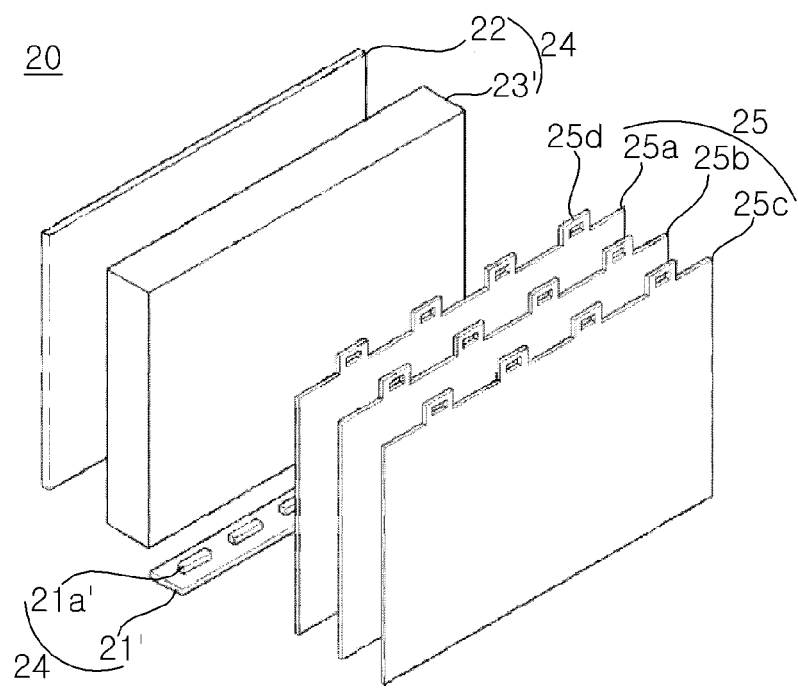

Referring to FIG. 4, the light source of the backlight unit 20 may be disposed at the edge of the backlight unit 20. The backlight unit 20 may include the optical layer 24, which is composed of a substrate 21', at least one light assembly 21a', the reflective sheet 22, and a light guide plate 23', and the optical sheet 25 positioned ahead of the optical layer 24.

The substrate 21' may extend in a lateral direction, and may be positioned adjacent to the lower side of the light guide plate 23'. The at least one light assembly 21a' may be mounted on the substrate 21'. Consequently, most of the light emitted from the light assembly 21a' may be transmitted to the inside of the light guide plate 23'. Here, the light guide plate 23' may reflect the incident light from the light assembly 21a' forwards. The diffusion plate 23 (not shown in FIG. 4) may also be provided on the front surface of the light guide plate 23'.

The reflective sheet 22 may be positioned behind the light guide plate 23'. The reflective sheet 22 may reflect the light, which is emitted from the light assembly 21a' or is reflected by the light guide plate 23', forwards.

Figure 5:
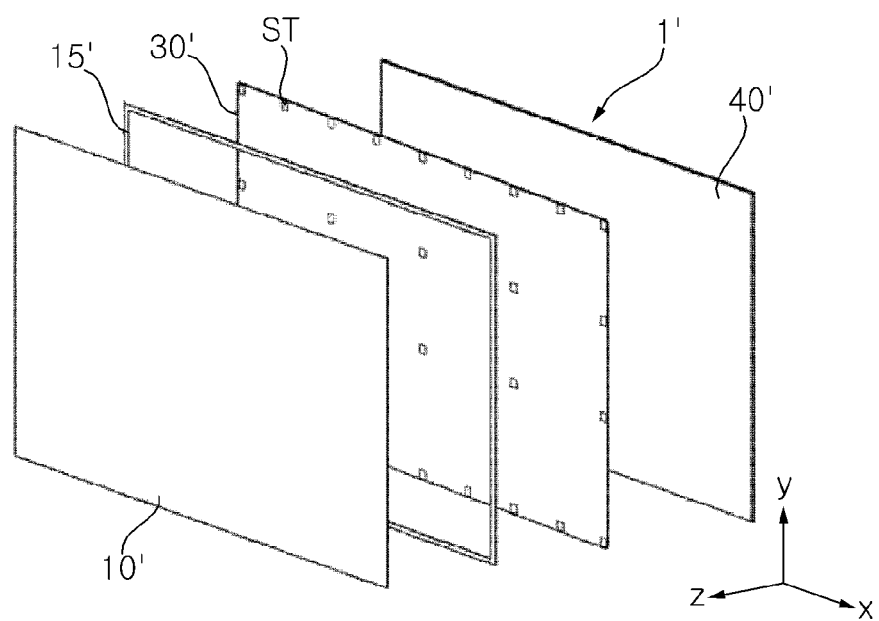

Referring to FIG. 5, a display device 1' may include a display panel 10', a middle frame 15', a frame 30' and a back cover 40', unlike the previous embodiments. Here, the display device 1' may be an OLED panel. The OLED panel is advantageous in that the display device 1' is capable of being formed extremely slim because there is no need for a backlight unit.

The display panel 10' may define the front surface of the display device 1', and may display an image on the front surface of the display device 1'. The display panel 10' may divide an image into a plurality of pixels, and may control the color, brightness and chroma of each of the pixels, thereby outputting the image. The display panel 10' may be divided into an active area, in which an image is displayed, and an inactive area, in which an image is not displayed. The display panel 10' may generate light corresponding to red, green or blue in response to a control signal.

The middle frame 15' may define the lateral side surface of the display device 1'. The middle frame 15' may be positioned behind the display panel 10', and the display panel 10' may be coupled to the middle frame 15'. The middle frame 15' may be configured to have a rectangular frame shape overall. For example, the middle frame 15' may include a metal material. Accordingly, the middle frame 15' may increase the torsional and/or bending rigidity of the display device 1'. Meanwhile, the middle frame 15' may be referred to as an inner frame, a middle cabinet or a panel guide.

The frame 30' may be coupled to the middle frame 15' from the rear side of the middle frame 15'. A printed circuit board (PCB), on which a plurality of electronic components are positioned, may be coupled to the frame 30'. Meanwhile, the frame 30' may be referred to as a main frame or a module cover.

The back cover 40' may be coupled to the frame 30' from the rear side of the frame 30'. The back cover 40' may define the rear surface of the display device 1'. For example, the back cover 40' may be injection-molded from a resin material. However, the back cover 40' may also include a metal material.

Figure 6:
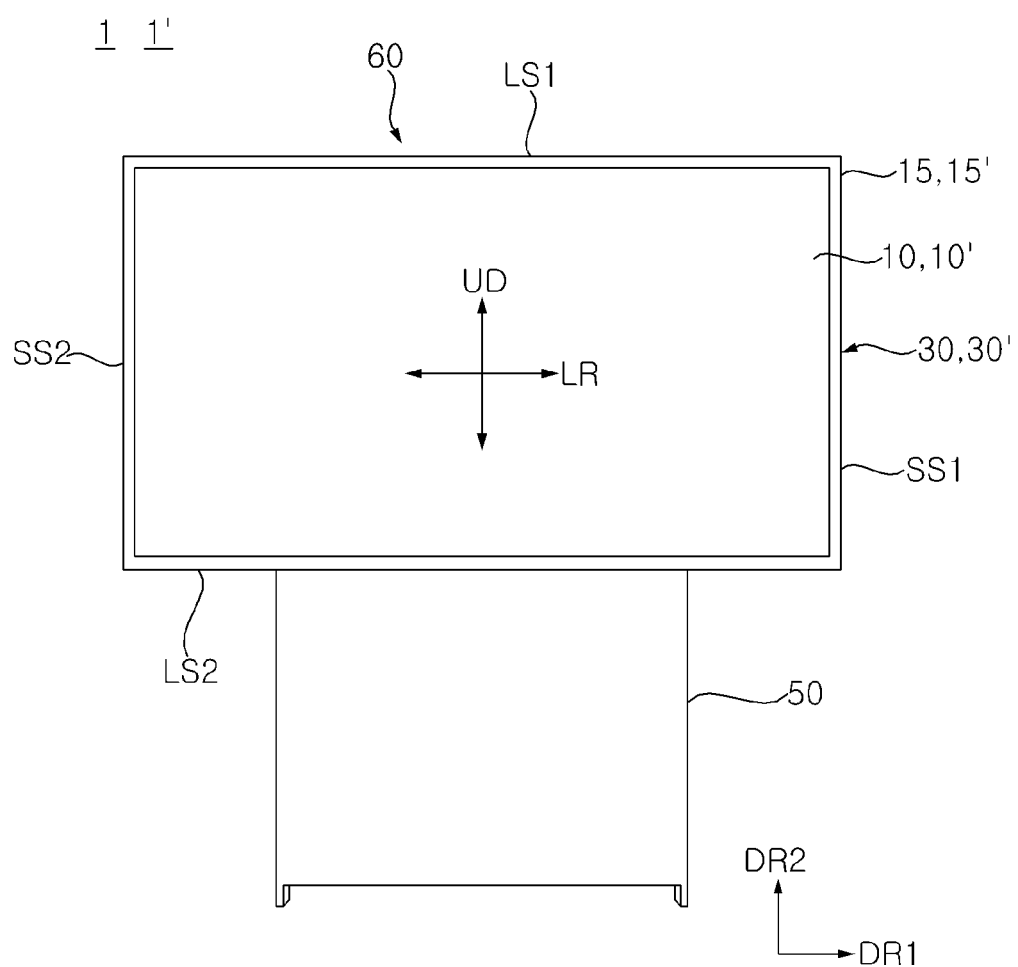
Figure 7:
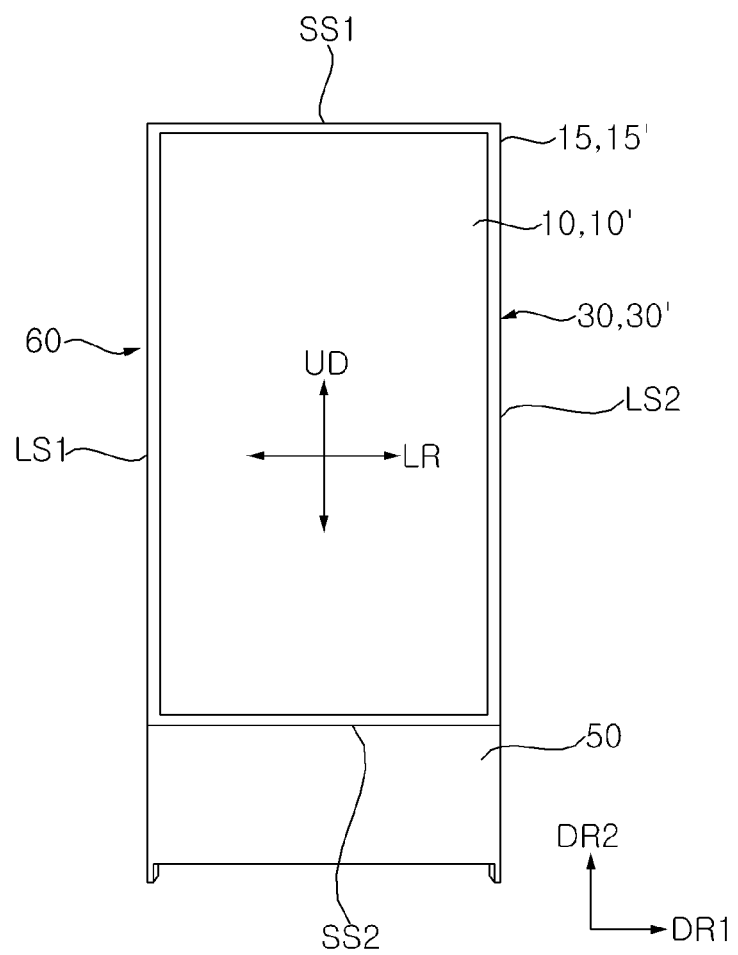

Referring to FIGS. 6 and 7, the display device 1; 1' may include a stand 50. The display panel 10; 10' and/or the frames 15 and 30; 15' and 30' may be coupled to the stand 50. The frames 15 and 30; 15' and 30' may include the middle frame 15; 15' and frame 20; 30'. The display panel 10; 10' and the frames 15 and 30; 15' and 30' may be collectively referred to as a head 60.

The head 60 may be rotated or pivoted about the stand 50. For example, the head 60 may be rotated or pivoted to 90 degrees about the stand 50. When the long sides LS1 and LS2 of the display panel 10; 10' are parallel to the first direction DR1, the display device 1; 1' may be in a landscape mode. When the long sides LS1 and LS2 of the display panel 10; 10' are parallel to the second direction DR2, the display device 1; 1' may be in a portrait mode. The head 60 may be rotatably or pivotably coupled to the stand 50 via a rotational assembly 100 to be described later.

Figure 8:
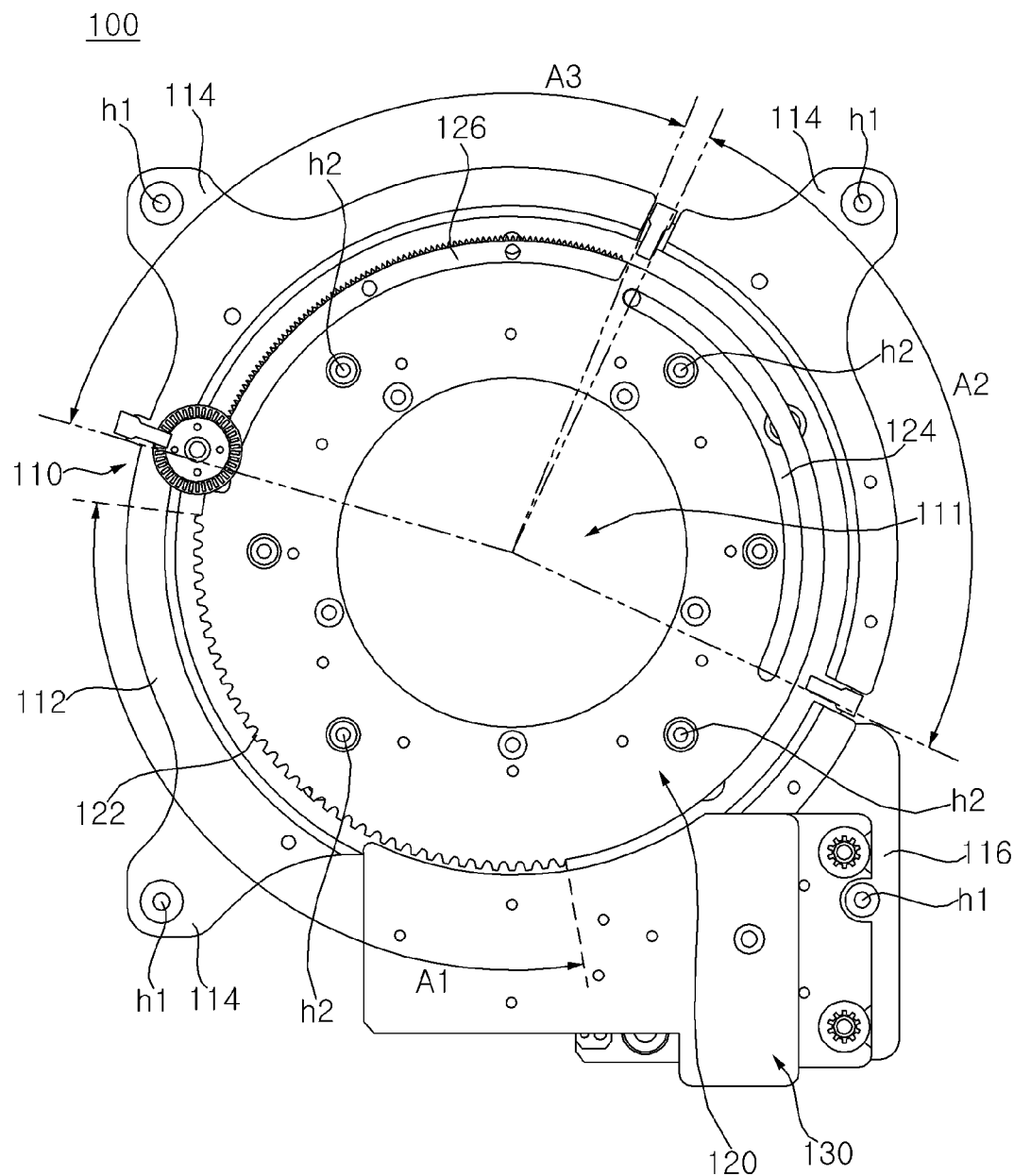

Referring to FIG. 8, the rotational assembly 100 may include a base 110. The base 110 may have a disc shape. The base 110 may have a circular bore 111. Legs 114 may radially extend from the outer edge of the base 110. Coupling holes h1 may be respectively formed in the legs 114. For example, the coupling holes h1 may be respectively positioned at the corners of a tetragon or a square. The coupling holes h1 may be referred to as outer coupling holes h1.

The rotational assembly 100 may include a rotating plate 120. The rotating plate 120 may have a disc shape. For example, the rotating plate 120 may have a doughnut shape. The rotating plate 120 may be rotated on the base 110. The head 60 (see FIGS. 6 and 7) may be coupled to the rotating plate 120 so as to be rotated therewith. The rotational center of the rotating plate 120 may be aligned with the center of the bore 111 in the base 110. Coupling holes h2 may be formed through the rotating plate 120 between the outer periphery and the inner periphery of the rotating plate 120. For example, the coupling holes h2 may be positioned at the corners of a tetragon or square. The inner coupling holes h2 may be referred to as inner coupling holes h2.

The distance between two adjacent outer coupling holes h1 may be two times the distance between two adjacent inner coupling holes h2. For example, the distance between two adjacent inner coupling holes h2 may be 100 mm, and the distance between two adjacent outer coupling holes h1 may be 200 mm.

The rotating plate 120 may include a drive gear 122. The drive gear 122 may be formed in the outer circumferential surface of the rotating plate 120. The drive gear 122 may be formed in a portion of the outer circumferential surface of the rotating plate 120. An angle corresponding to the region of the outer circumferential surface of the rotating plate 120 in which the drive gear 122 is formed may be referred to a first angle A1. For example, the first angle A1 may range from 80 degrees to 100 degrees. Preferably, the first angle A1 may range from 85 degrees to 95 degrees. More preferably, the first angle A1 may be 90 degrees.

A guide slot 123 may be formed through the rotating plate 120 between the outer periphery and the inner periphery of the rotating plate 120. An angle corresponding to the region of the rotating plate 120 in which the guide slot 124 is formed may be referred to as a second angle A2. For example, the second angle A2 may be 90 degrees.

A counting gear 126 may be positioned adjacent to the outer circumferential surface of the rotating plate 120. The counting gear 126 may be a sector-shaped plate, and may be coupled to the rotating plate 120 in the state of being adjacent to the rotating plate 120. An angle corresponding to the region of the rotating plate 120 in which the counting gear 126 is formed may be referred to as a third angle A3. For example, the third angle A3 may be 90 degrees.

A drive mount 116 may be formed at one side of the base 110. A drive module 130 may be mounted on the drive mount 116 so as to provide the rotating plate 120 with rotative force.

Figure 9:
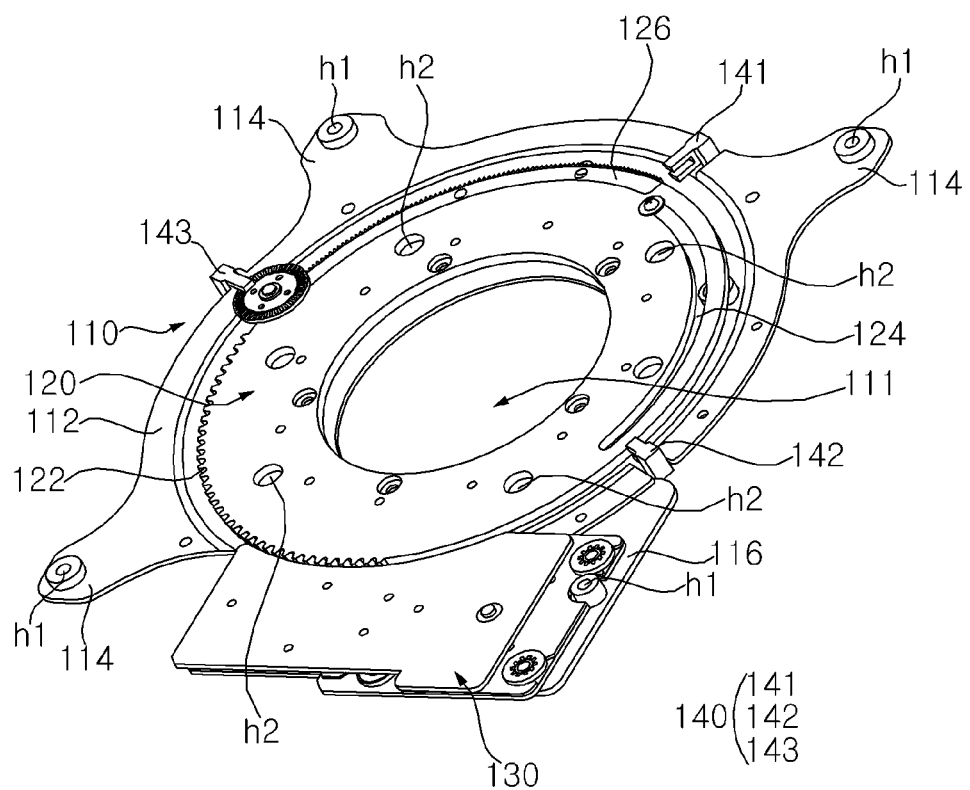
Figure 10:
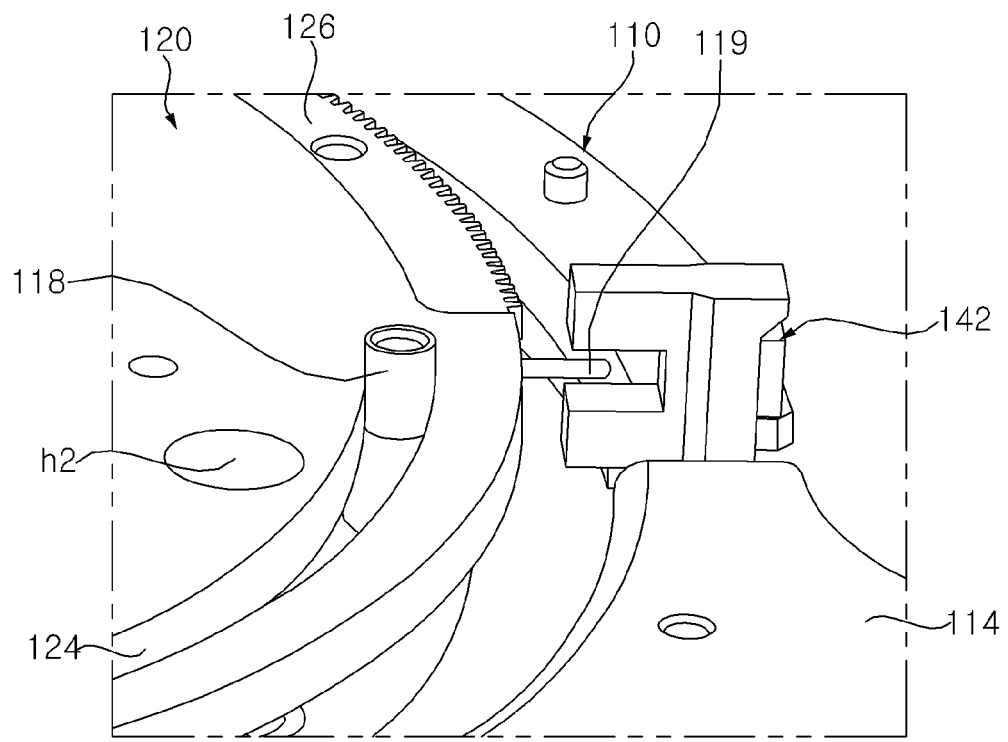
Figure 11:
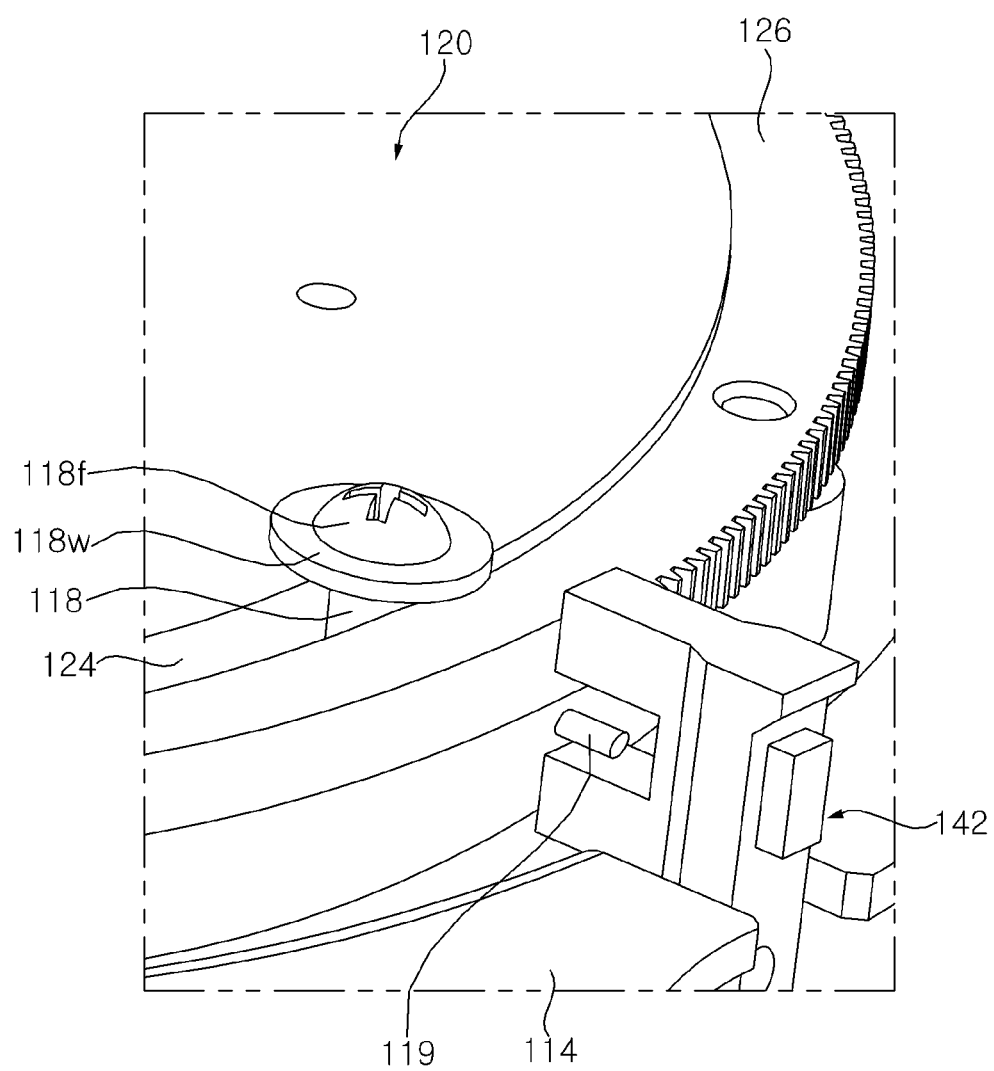

Referring to FIGS. 9 to 11, a slot pin 118 may project from the base 110. The slot pin 118 may be disposed in the guide slot 124. The slot pin 118 may move in the guide slot 124. A washer 118w and/or a fastening element 118f may be coupled to the slot pin 118. The diameter of the washer 118w may be larger than the diameter of the slot pin 118. For example, the fastening element 118f may be engaged in the slot pin 118. The diameter of the fastening element 118f may be larger than the diameter of the slot pin 118.

When the rotating plate 120 is rotated on the base 110, the slot pin 118 may move relative thereto in the guide slot 124, and may limit the movement of the rotating plate 120. The movement of the rotating plate 120 may be pivoting or rotation.

An indicator 119 may extend from the outer circumferential surface of the rotating plate 120 in the radial direction of the rotating plate 120. A sensor 140 may be mounted on the base 110 adjacent to the outer circumferential surface of the rotating plate 120. For example, the sensor 140 may be a photo sensor. The indicator 119 may pass through the sensor 140 when the rotating plate 120 is rotated.

The sensor 140 may include a plurality of sensors. Among the sensors, the first sensor 141 may be positioned at one end of the guide slot 124, and a second sensor 142 may be positioned at the other end of the guide slot 124. The angle defined between the line that extends to the first sensor 141 from the rotational center of the rotating plate 120 and the line that extends to the second sensor 142 from the rotational center may be 90 degrees. A third sensor 143 may be positioned so as to be opposite the second sensor 142 about the rotational center of the rotating plate 120.

Figure 12:
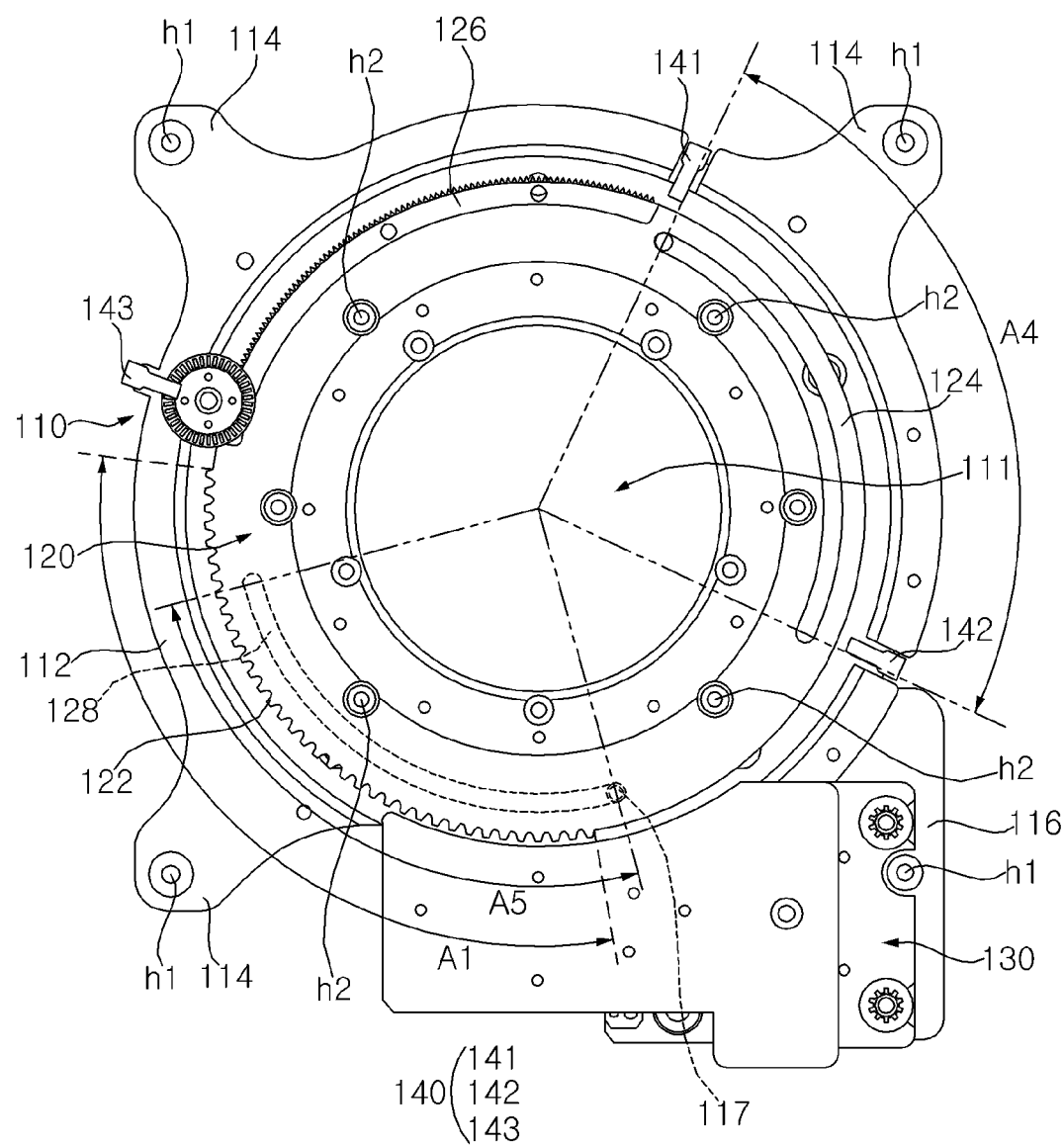
Figure 13:
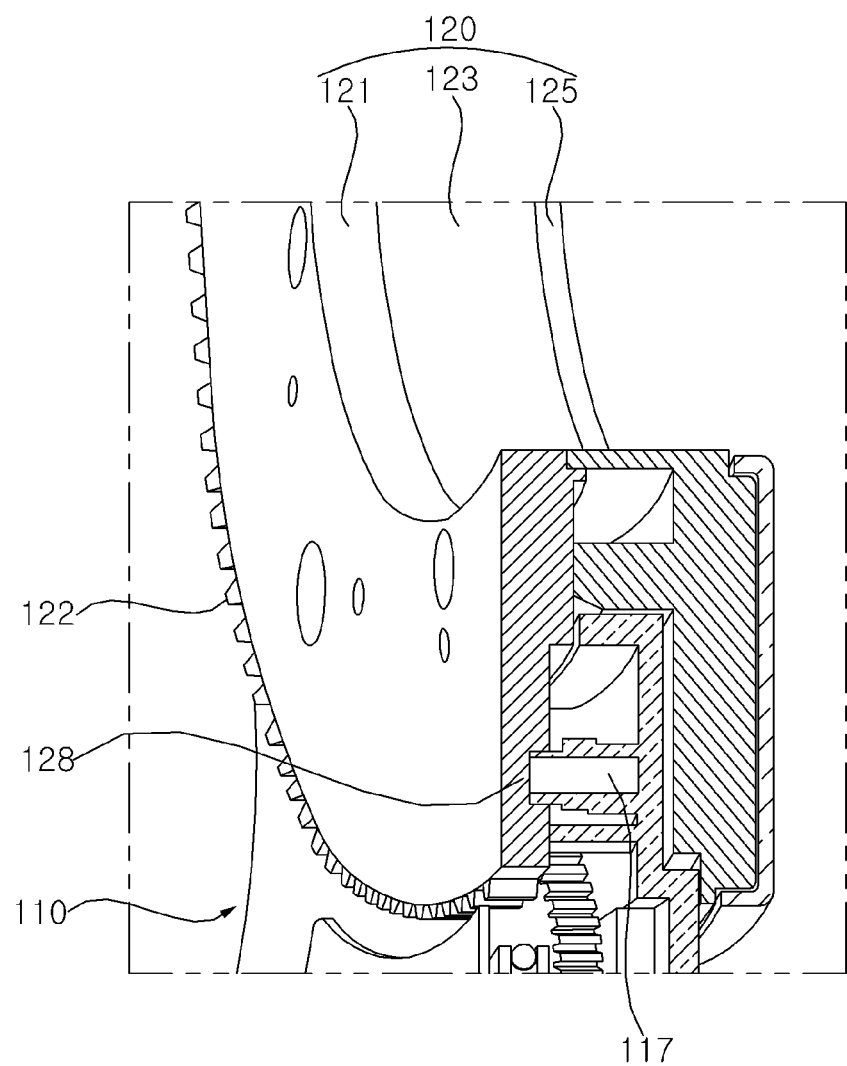

Referring to FIGS. 12 and 13, the rotating plate 120 may include a first part 121, a second part 123 and a cover plate 125. The first part 121 may face the second part 123. The first part 121 may be positioned on one surface of the base 110, and the second part 123 may be positioned on the other surface of the base 110. The first part 121 may face the second part 123 with the base 110 interposed therebetween. The first part 121 may be coupled to the second part 123, and may be rotated relative to the base 110. The cover plate 125 may be coupled to the second part 123. The cover plate 125 may face the first part 121 with the second part 123 interposed therebetween.

The guide slot may include a plurality of guide slots 124 and 128. A first guide slot 124 may be the guide slot 124 that has previously been described with reference to FIGS. 8 to 11. The first guide slot 124 may be formed within a range of a fourth angle A4. For example, the fourth angle A4 may be 90 degrees. A second guide slot 128 may be formed in the rotating plate 120 so as to have the form of a groove. The second guide slot 128 may face the first guide slot 124 across the rotational center of the rotating plate 120.

The second guide slot 128 may be formed in the inner surface of the first part 121 of the rotating plate 120. The inner surface of the first part 121 may face the base 110 and/or the second part 123. For example, the second guide slot 128 may define an arched shape. The second guide slot 128 may be formed within a range of a fifth angle A5. For example, the fifth angle A5 may be 90 degrees. The second guide slot 128 may face the first guide slot 124 across the rotational center of the rotating plate 120. Accordingly, it is possible not only to ensure stability of rotation or pivoting of the rotating plate 120 but also to maintain the equilibrium of the rotating plate 120 while limiting the range of rotation or pivoting of the rotating plate 120.

The slot pin may include a plurality of slot pins 117 and 118. The first slot pin 118 may be the slot pin that was previously described with reference to FIGS. 8 to 11. A second slot pin 117 may be inserted into the second guide slot 128. The second slot pin 117 may project from the base 110, and may move in the second guide slot 128.

The second guide slot 128 may be formed in the region overlapping the drive gear 122. The range of the fifth angle A5 may at least partially overlap the range of the first angle A1. Consequently, it is possible to prevent damage to the rotating plate 120 caused by the force applied to the drive gear 122 and to increase the durability of the rotating plate 120.

Figure 14:
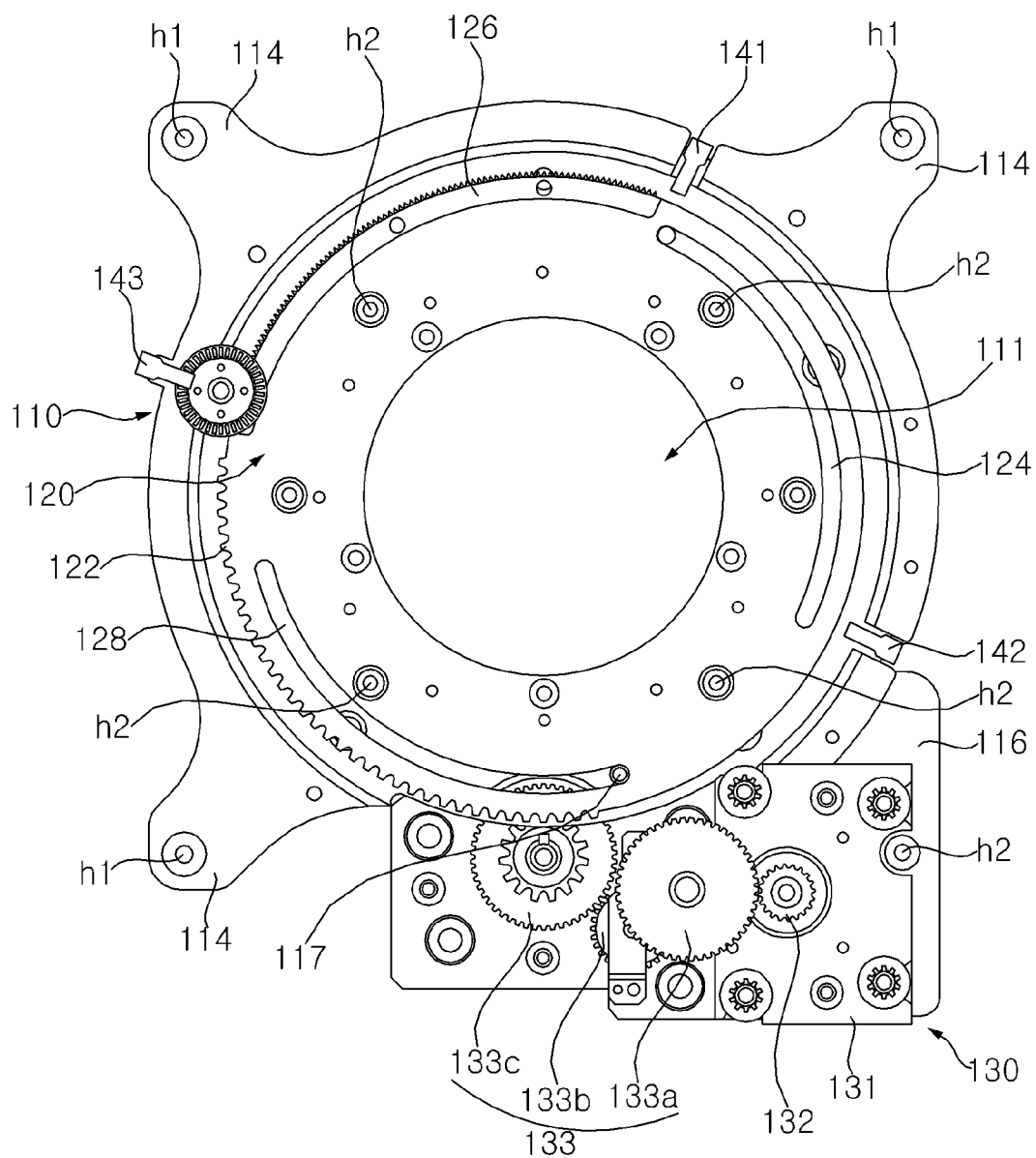

Referring to FIG. 14, the second guide slot 128 may be a slit, which is formed through the rotating plate 120. The drive module 130 may include a motor 131, a motor gear 132, and a transmission gear 133. The motor 131 may be fixed to the drive mount 116. The motor gear 132 may be coupled or fixed to the rotating shaft of the motor 131. The transmission gear 133 may mechanically connect the motor gear 132 to the drive gear 122.

The transmission gear 133 may control the rotational frequency of the motor 131 and the rotational frequency of the rotating plate 120 so as to establish various ratios therebetween. For example, the transmission 133 may reduce the rotational frequency of the rotating plate 120 relative to the rotational frequency of the motor 131. Alternatively, the transmission gear 133 may increase the rotative force of the motor 131, and may rotate the rotating plate 120 using the increased rotative force.

Figure 15:
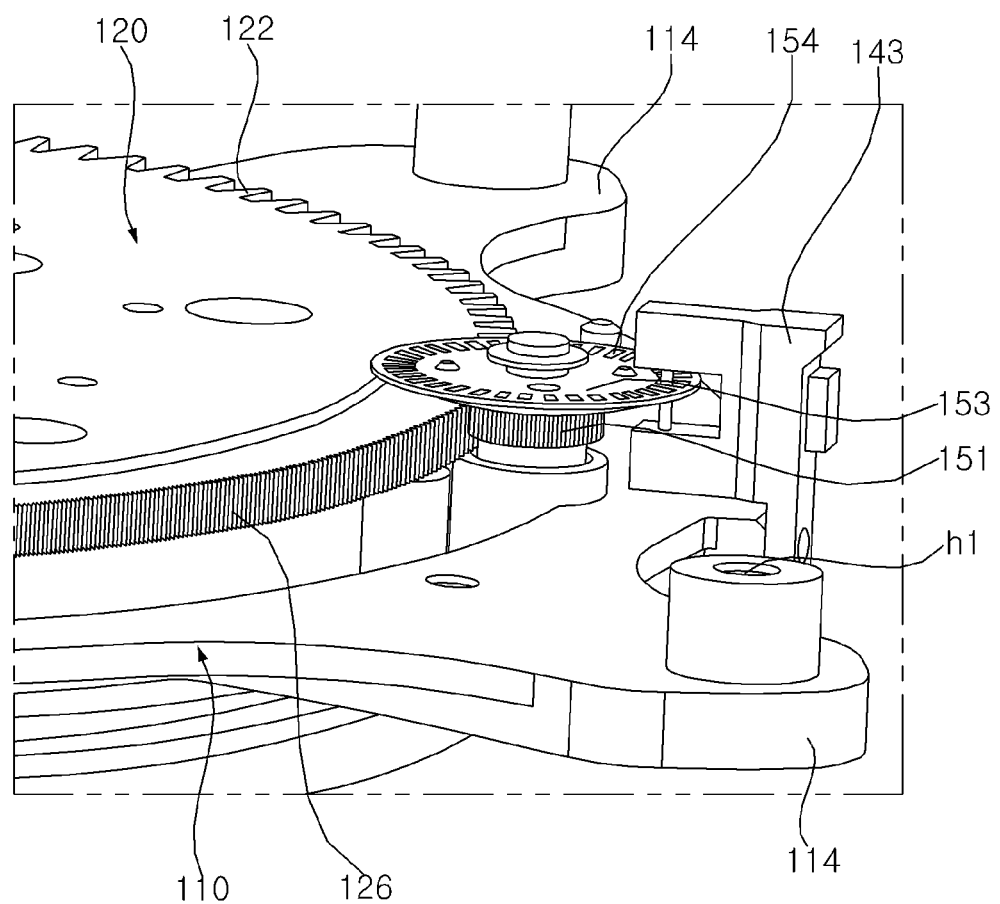

Referring to FIGS. 14 and 15, the counting gear 126 may be formed in the outer circumferential surface of the rotating plate 120. For example, the counting gear 126 may have 360 teeth or less. A wheel gear 151 may be engaged with the counting gear 126. The wheel gear 151 may be rotatably mounted on the base adjacent to the counting gear 126. The number of teeth of the wheel gear 151 may correspond to the number of teeth of the counting gear 126. For example, the wheel gear 151 may have 360 teeth or less.

A wheel 153 may be coupled to the wheel gear 151 so as to be rotated therewith. The diameter of the wheel 153 may be larger than the diameter of the wheel gear 151. The wheel 153 may have a plurality of holes 154 formed in the periphery thereof. For example, the plurality of holes 154 may be 360 or less. Specifically, the number of teeth of the counting gear 126 may be 360, the number of teeth of the wheel gear 151 may be 360, and the number of holes 154 may be 360.

The sensor 143 may be positioned adjacent to the wheel 153. For example, the sensor 143 may be a photo sensor. The sensor 143 may detect the rotation of the wheel 153. A controller may consider 360 degrees to be one turn. Accordingly, even when the display device is rebooted after the wheel 153 is rotated to a certain angle, the controller may identify the certain angle to which the wheel 153 had been rotated.

Figure 16:
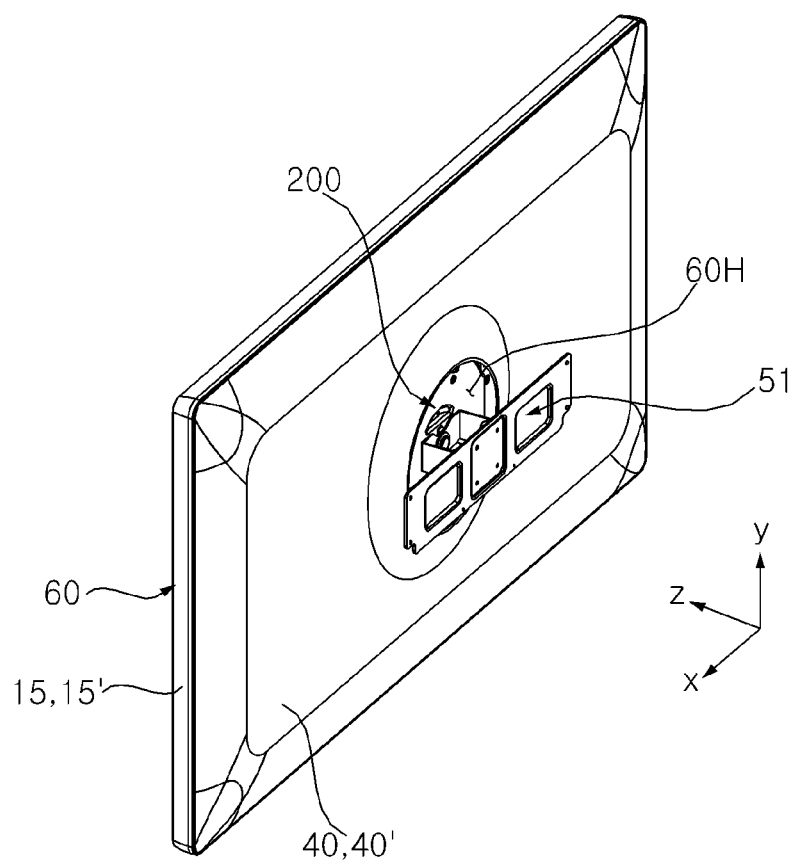

Referring to FIG. 16, the head 60 may include the back cover 40; 40'. The head 60 may be inclined with respect to the stand 50 (see FIGS. 6 and 7) by means of a tilt assembly 200 to be described later. Here, the head 60 may be rotated about an axis parallel to the lateral direction or the first direction DR1.

A bracket 51 may be fixed to the stand 50 (see FIGS. 6 and 7). The tilt assembly 200 may be detachably coupled to the bracket 51 through a hole 60H formed in the back cover 40; 40'.

Figure 17:
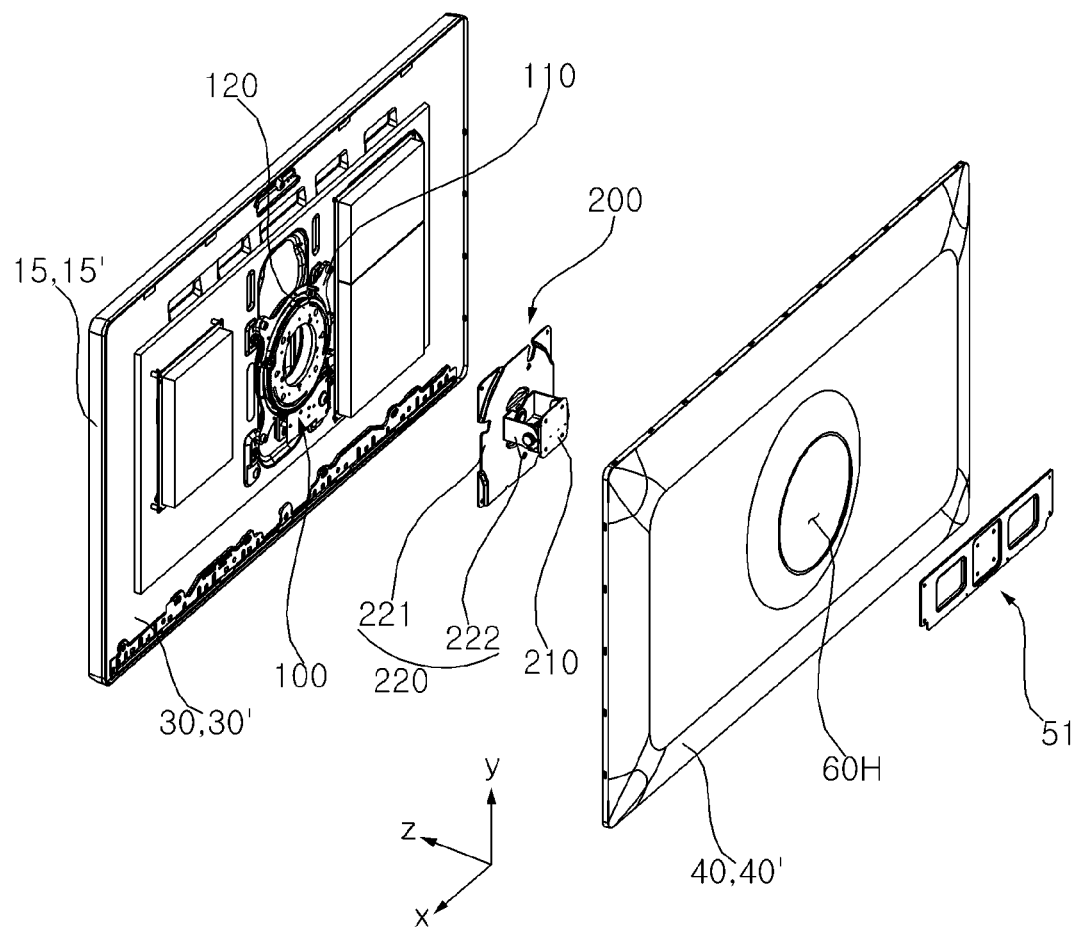
Figure 18:
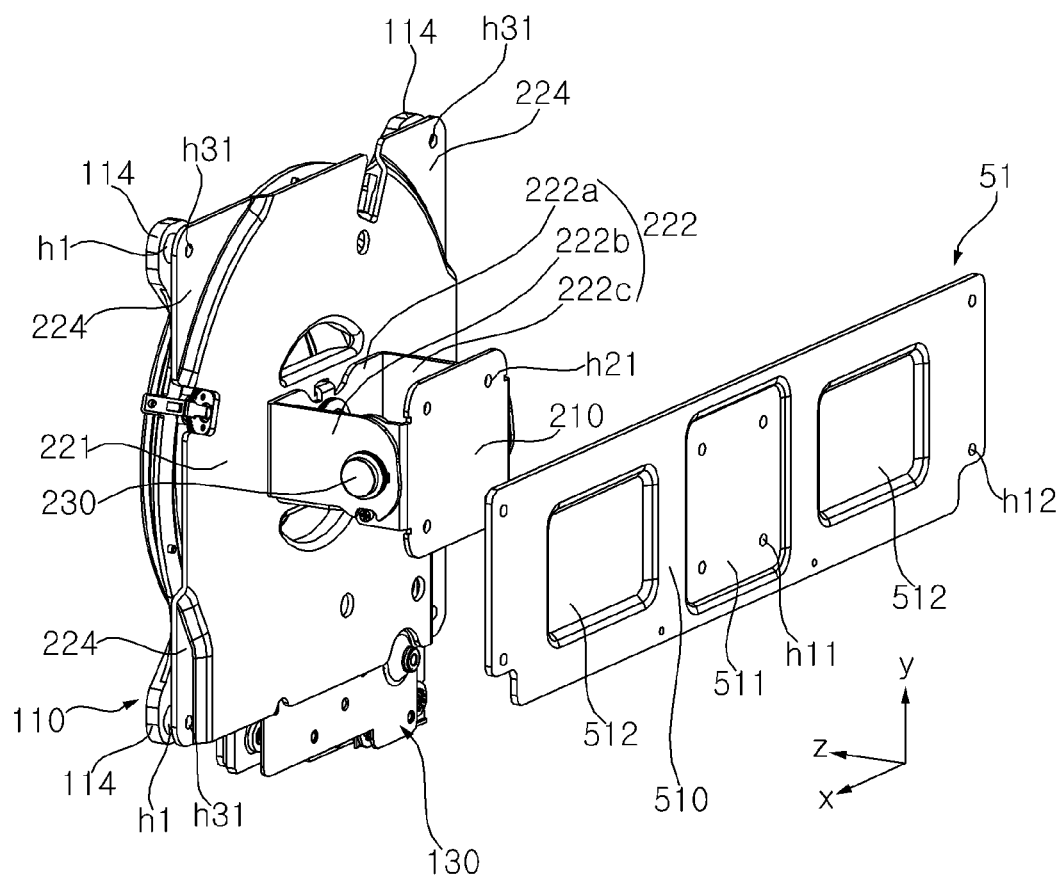

Referring to FIGS. 17 and 18, the bracket 51 may include a body 510, which is configured to have a plate shape overall. The bracket 51 may include reinforcing portions 512, which project forwards from the body 510. The body 510 may have formed therein holes h12, through which fastening elements fastened to the stand 50 (see FIGS. 6 and 7) extend.

The rotational assembly 100 and the tilt assembly 200 may be disposed between the frame 30; 30' and the bracket 51, and may be coupled thereto. Here, the tilt assembly 200 may be positioned behind the rotational assembly 100.

The rotating plate 120 of the rotational assembly 100 may be coupled to the frame 30; 30' so as to be rotated therewith. The rotational axis of the rotating plate 120 may be parallel to the anteroposterior direction.

The tilt assembly 200 may include a holder 210 and a rotating body 220. The holder 210 may define the rear surface of the tilt assembly 200, and may be fixed to the bracket 51. The rotating body 220 may be positioned in front of the holder 210, and may be rotatably coupled to the holder 210. The rotating body 220 may be fixed to the rotational assembly 100.

The holder 210 may have therein holes h21, through which fastening elements fastened to a coupling portion 511 extend. The coupling portion 511 may project forwards from the body 510, and may have therein holes h11 communicating with the holes h21.

The rotating body 220 may include a plate 221 and a connector 222.

The plate 221 may include recesses 224, which are depressed forwards from the rear surface of the plate 221 at the corners of the plate 221. The recesses 224 may face the legs 114, and may have holes h31 communicating with the coupling holes h1. Here, the base 110 may be fixed to the plate 221 by means of fastening elements, such as screws, which extend through the coupling holes h1 and the holes h31.

The connector 222 may be disposed between the plate 221 and the holder 210. The connector 222 may be fixed to the plate 221 at the rear side of the plate 221. The connector 222 may be rotatably coupled to the holder 210. The rotational axis of the connector 222 may be parallel to the lateral direction. The rotational axis may be coaxial with the central axis of a rod 230 to be described later.

Figure 19:
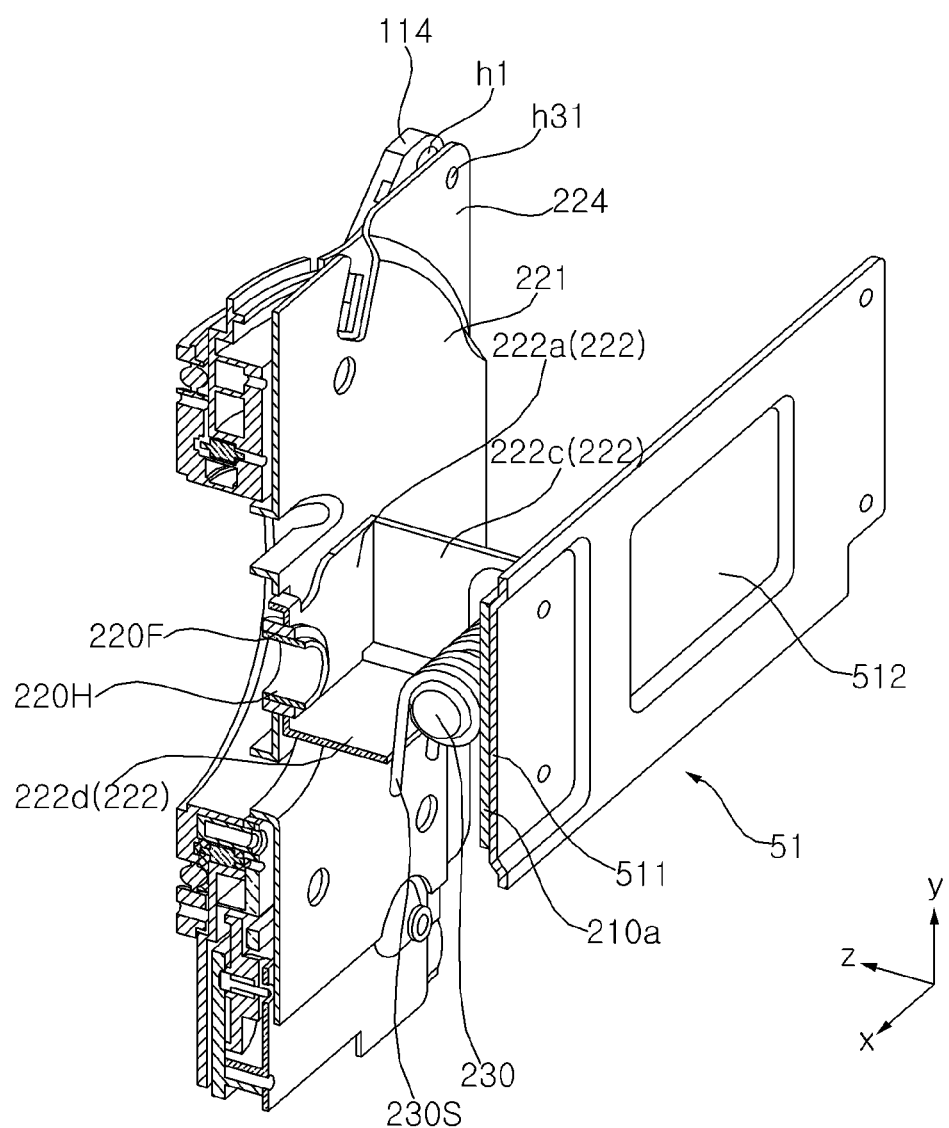
Figure 20:
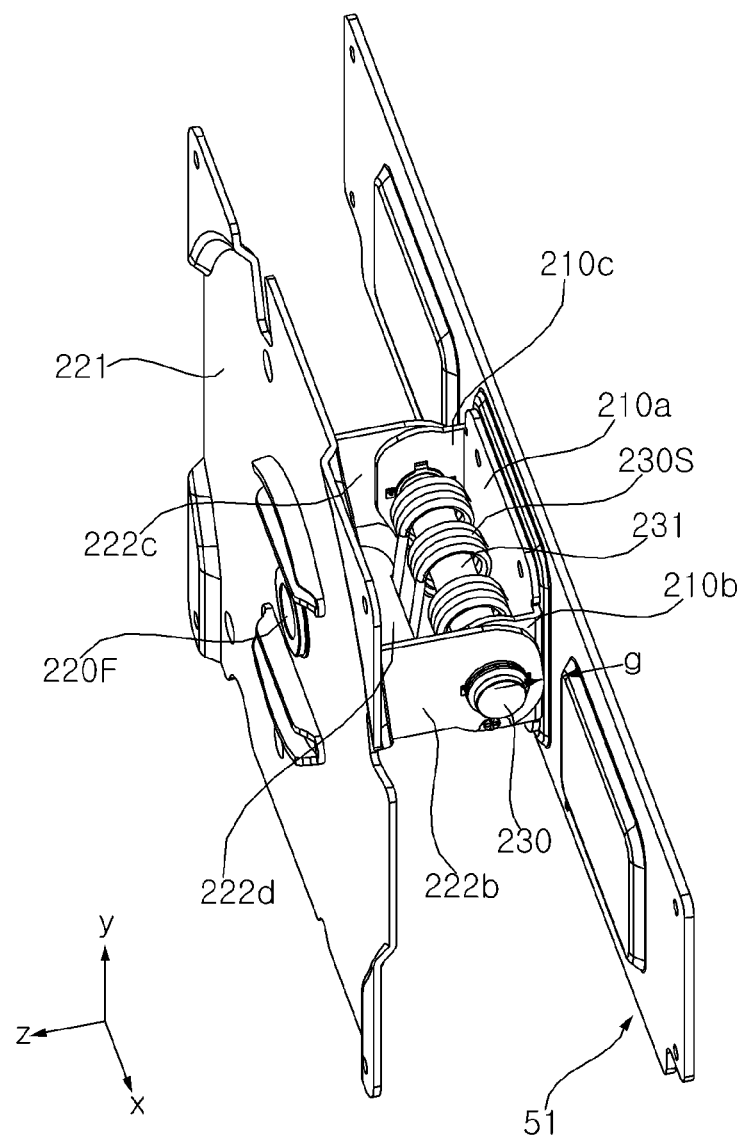

Referring to FIGS. 19 and 20, the connector 222 may include a first part 222a, a second part 222b, a third part 22c, and a fourth part 222d.

The first part 222a may define the front surface of the connector 222. The first part 222a may be fixed to the plate 221. For example, a coupling hole 220H may be formed through the plate 221 and the first part 222a. Here, a fastening element 220F may be coupled to the plate 221 and the first part 222a through the coupling hole 220H. The second part 222b may be bent rearwards from the first part 222a so as to define the left surface of the connector 222. The third part 222c may be bent rearwards from the first part 222a so as to define the right surface of the connector 222. The fourth part 222d may be bent rearwards from the first part 222a so as to define the lower surface of the connector 222. The second part 222b may be spaced apart from the third part 222c, with the fourth part 222d interposed therebetween. Each of the second part 222b and the third part 222c may have therein a hole (not shown), through which the rod 230 to be described later extends.

The holder 210 may include a body 210a, a first wing 210b, and a second wing 210c. The body 210a may define the rear surface of the holder 210, and may be fixed to the coupling portion 511 of the bracket 51. The first wing 210b may be bent forwards from the body 210a so as to define the left surface of the holder 210. The second wing 210c may be bent forwards from the body 210a so as to define the right surface of the holder 210. The outer surface of the first wing 210b may be in contact with the inner surface of the second part 222b, and the outer surface of the second wing 210c may be in contact with the inner surface of the third part 222c. Each of the first wing 210b and the second wing 210c may have therein a hole (not shown), through which the rod 230 to be described later extends.

Figure 21:
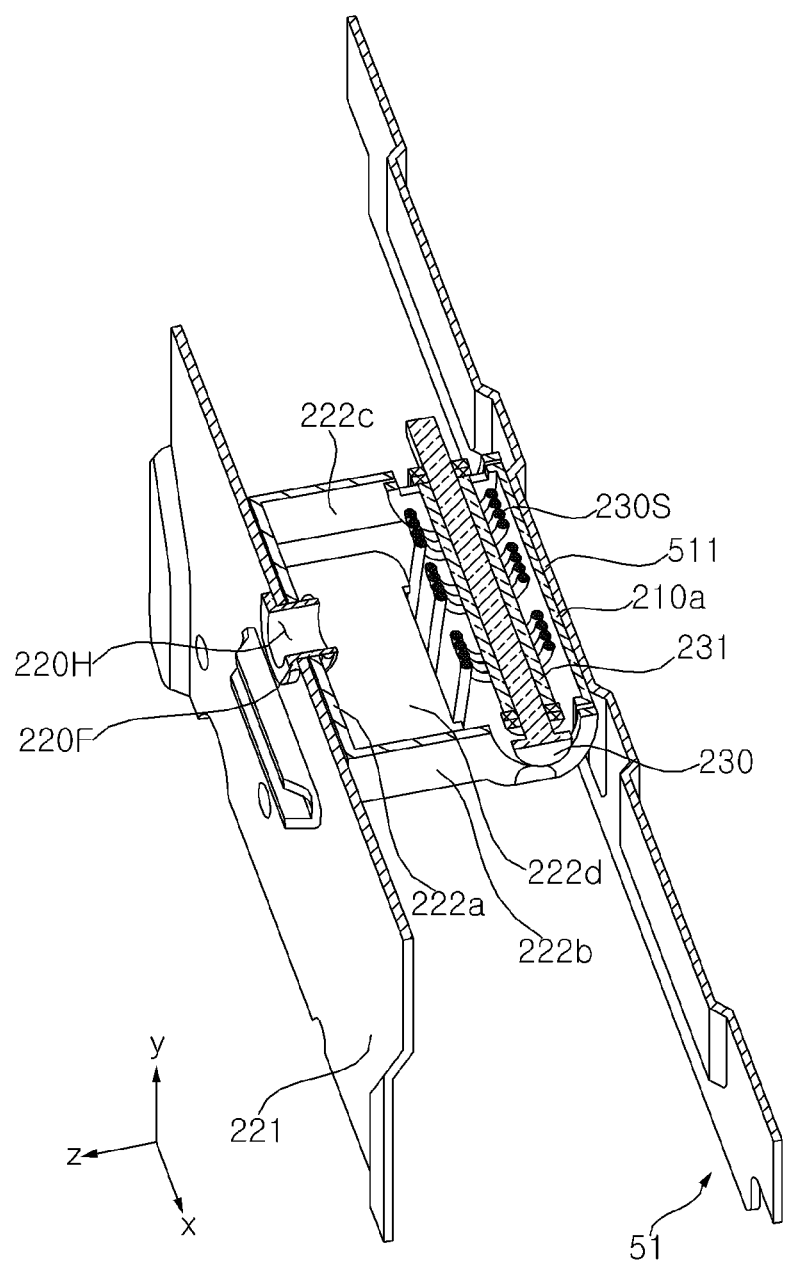
Figure 22:
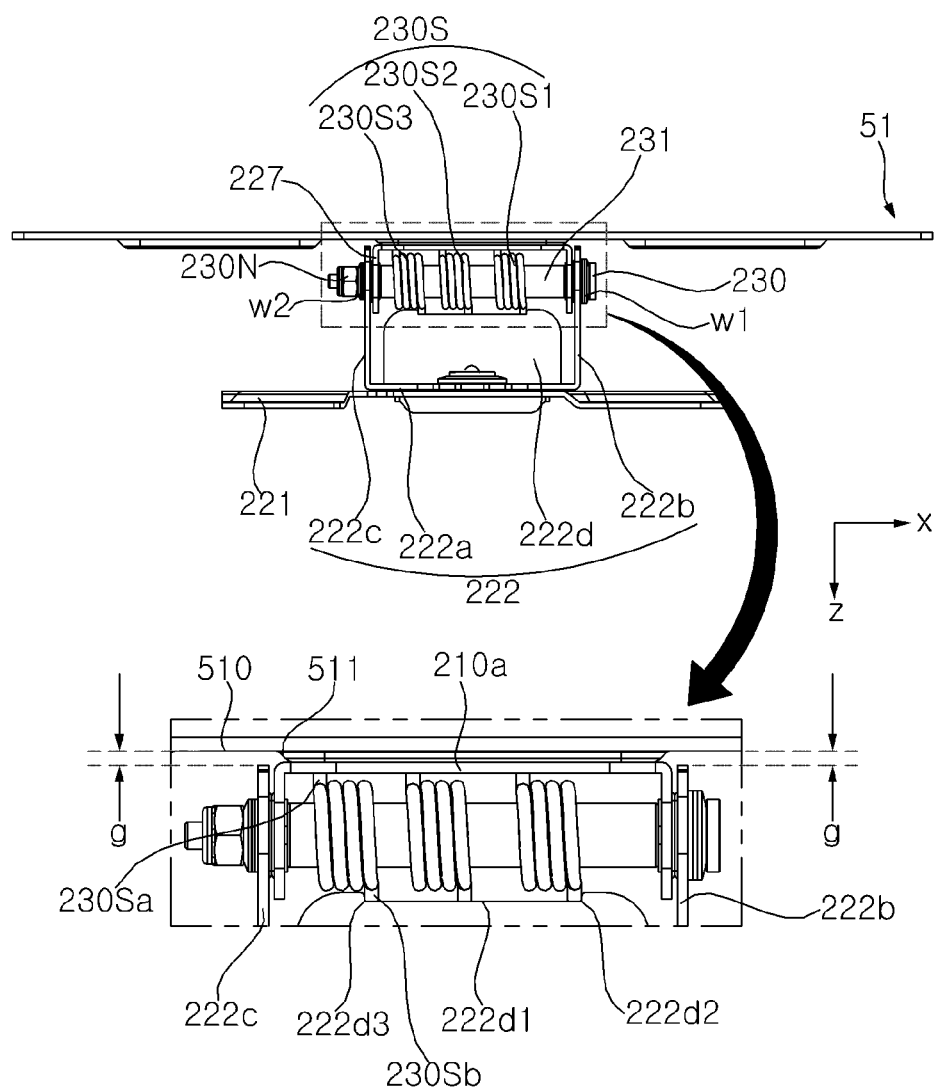

Referring to FIGS. 21 and 22, the rod 230 may extend in the lateral direction. The rod 230 may extend through the second part 222b, the first wing 210b, the second wing 210c and the third part 222c in that order. For example, the rod 230 may be composed of a long bolt, and may be engaged with a nut 230N. Here, the second part 222b, the first wing 210b, the second wing 210c and the third part 222c may be disposed between the head provided at one end of the rod 230 and the nut 230N provided adjacent to the other end of the rod 230. A first washer w1 may be disposed between the head of the rod 230 and the second part 222b, and a second washer w2 may be disposed between the nut 230N and the third part 222c.

An elastic member 230S, which is a member capable of being elastically deformed, may generate an elastic force or a restoring force, and tends to return to the original state when deformed from the original state. The elastic member 230S may be positioned between the body 210a and the fourth part 222d. One end 230sa of the elastic member 230S may be fixed to the body 210a. For example, the other end 230Sb of the elastic member 230S may be a free end, and may not contact or interfere with other components such as the plate 221. Alternatively, the other end 230Sb of the elastic member 230S may be in contact with or be spaced apart from the plate 221 of the rotating body 220 depending on the direction and angle of rotation of the rotating body 220. The elastic member 230S may include a plurality of elastic members 230S1, 230S2 and 230S3. For example, the elastic member 230S may be a spring.

The fourth part 222d may include a recess 222d1, which is depressed forwards from the rear side of the fourth part 222d. The recess 222d may be supported by the elastic member 230S at a position adjacent to the other end of the elastic member 230S. For example, the first elastic member 230S1 may be supported by the fourth part 222d at the left end 222d2 of the recess 222d1, the third elastic member 230S3 may be supported by the fourth part 222d at the right end 222d3 of the recess 222d1, and the second elastic member 230S2 may be disposed between the first elastic member 230S1 and the third elastic member 230S3.

A sleeve 231 may surround the outer circumferential surface of the rod 230 between the first wing 210b and the second wing 210c. The sleeve 231 may be configured to have the form of a cylinder. Here, the elastic member 230S may be wound around the outer circumferential surface of the sleeve 231.

The second part 222b and the third part 222c may be spaced forwards apart from the body 510 of the bracket 51 by a predetermined distance g.

Figure 23:
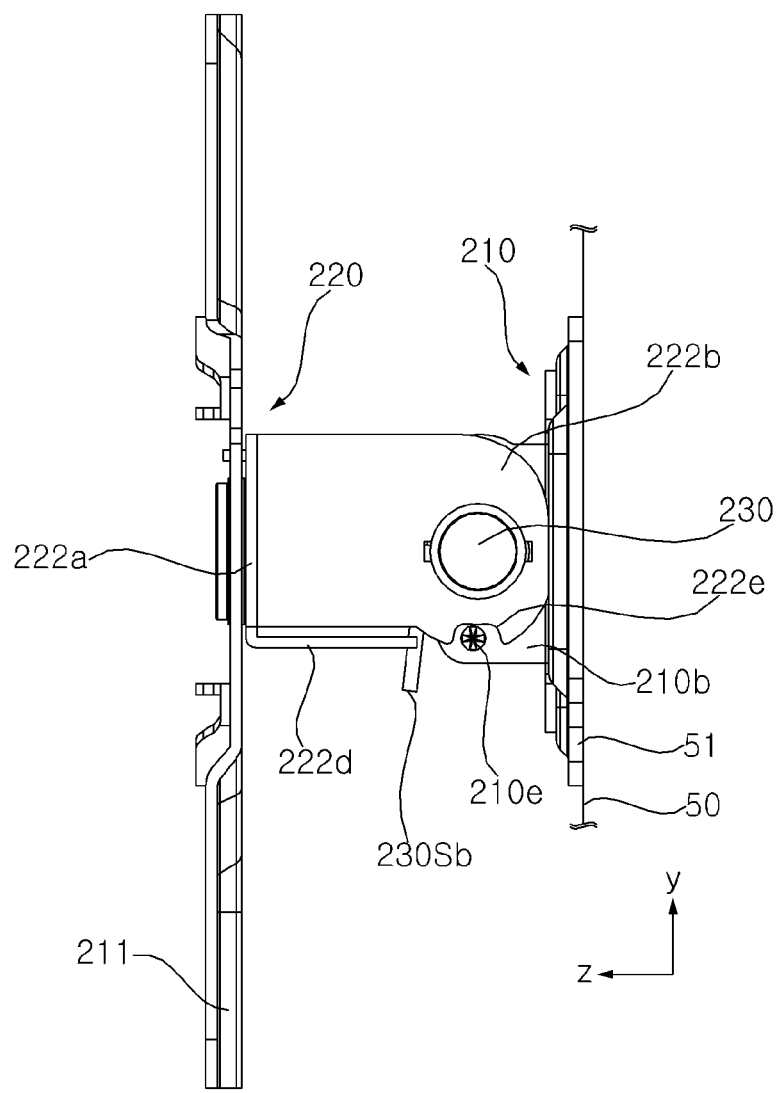

Referring to FIG. 23, the connector 222 may include an engagement recess 2223, which is depressed upwards from the lower side of the second part 222b. The holder 210 may include a stopper 210e, which projects outwards from the outer surface of the first wing 210b. The engagement recess 222e may be spaced apart from the stopper 210e, and may surround a portion of the stopper 210e. The stopper 210e may be positioned on the rotational orbit of the engagement recess 222e, and may limit the rotation of the engagement recess 222e and the connector 222.

The engagement recess 222e and the stopper 210e may also be provided at the third part 222c and the second wing 210c.

Figure 24:
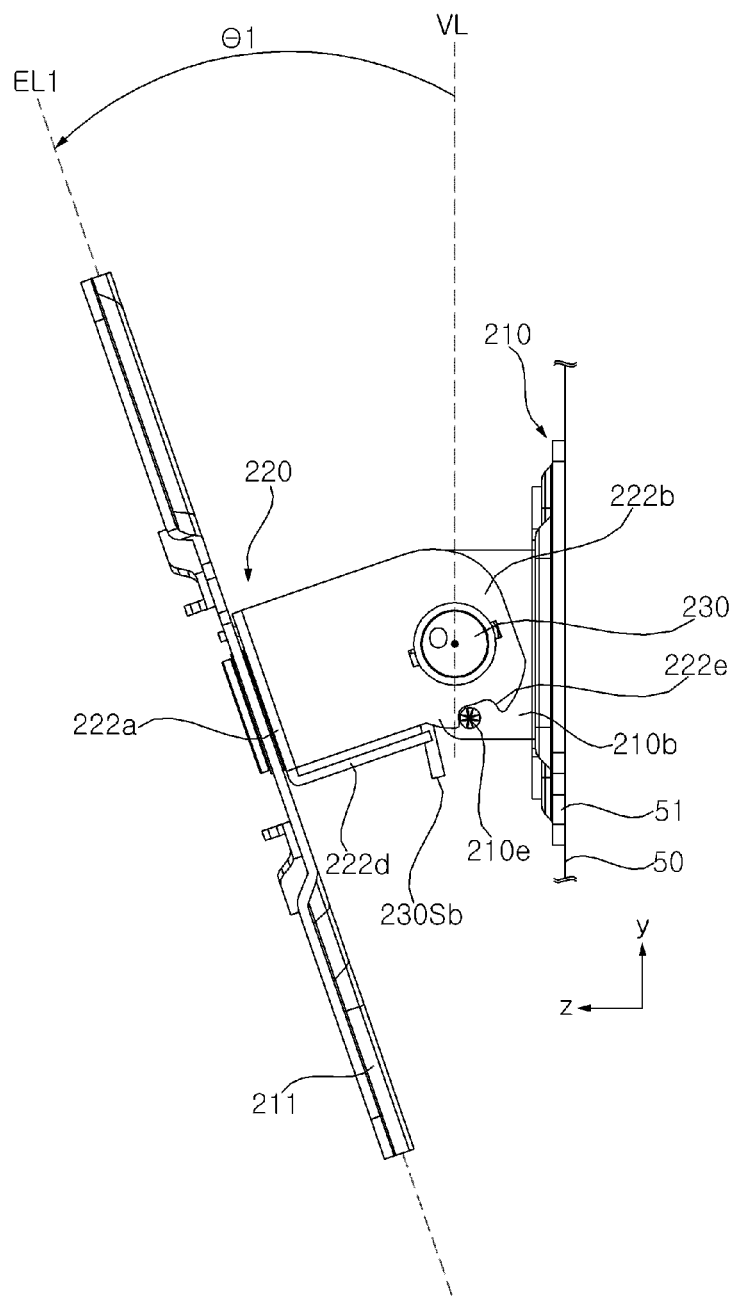
Figure 25:
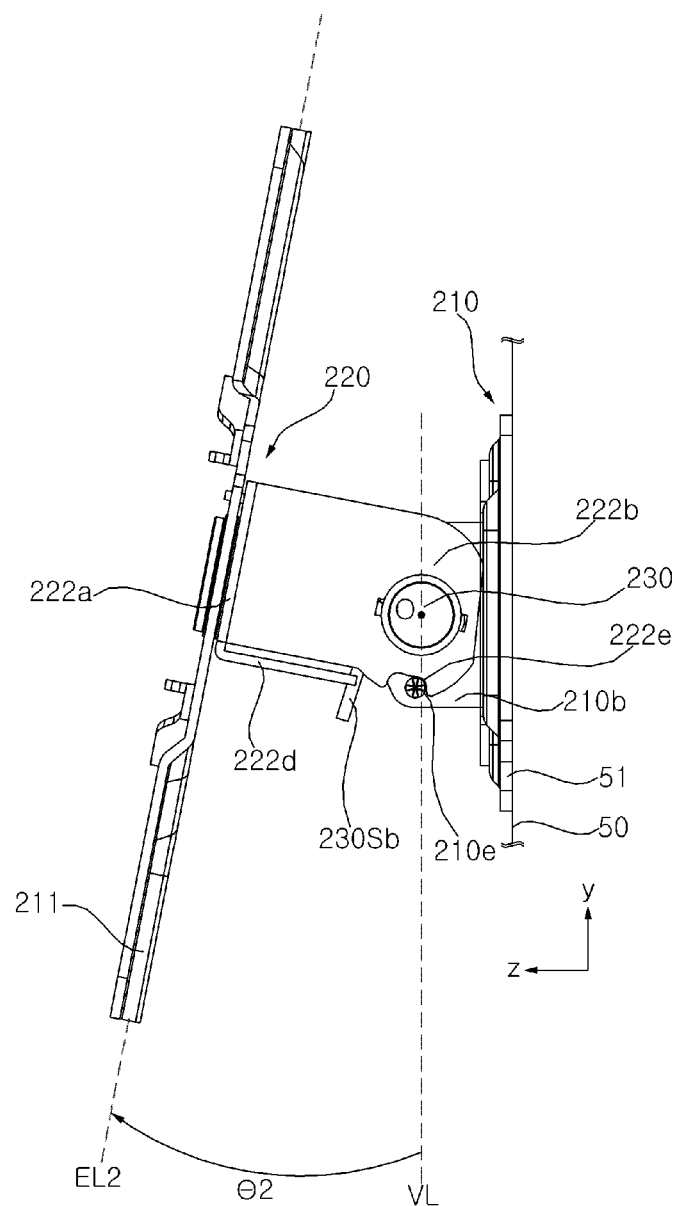

Referring to FIGS. 23 to 25, the rotating body 220 may be rotated about the rotational axis, which is parallel to the lateral direction and extends through the center O of the rod 230. For example, the rotating body 220 may be rotated about the rotational axis together with the rod 230. Here, the sleeve 231, which surrounds the outer circumferential surface of the rod 230, and the elastic member 230S wound around the sleeve 231, may not be rotated. Alternatively, the rod 230, the sleeve 231 and the elastic member 230S may not be rotated, but the rotating body 220 may be rotated about the rotational axis.

Referring to FIG. 23, the plate 221 of the rotating body 220 may be disposed parallel to the vertical direction. Because the elastic force or the restoring force of the elastic member 230S is applied to the fourth part 222d of the rotating body 220, the rotating body 220 may be maintained in the current vertical state by virtue of equilibrium of force.

Referring to FIG. 24, the rotating body 220 may be inclined counterclockwise to a first angle θ1 with respect to the vertical line VL, which extends vertically through the center O of the rod 230, by the force applied by a user. Here, the other end 230Sb of the elastic member 230S may be bent toward the sleeve 231 (see FIG. 22). The elastic deformation of the elastic member 230S may be halted when the stopper 210e is engaged with the front end of the engagement recess 222e. Consequently, the rotating body 220 may be maintained in the current state, which is inclined downwards. In this state, a user is able to easily rotate the rotating body 220 to the non-inclined state from the downwardly inclined state by virtue of the elastic force or the restoring force of the elastic member 230S.

Referring to FIG. 25, the rotating body 220 may be inclined clockwise to a second angle θ2 with respect to the vertical line VL, which extends upwards through the center O of the rod 230, by the force applied by the user. At this time, the other end 230Sb of the elastic member 230S may be restored to a position away from the sleeve 231 (see FIG. 22). The elastic restoration of the elastic member 230S may be halted when the stopper 210e is engaged with the rear end of the engagement recess 222e. Consequently, the rotating body 220 may be maintained in the upwardly inclined state.

Accordingly, the head 60 (see FIGS. 6 and 7) may be inclined upwards or downwards with respect to the stand 50. Furthermore, the head 60 may be rotate or pivoted with respect to the stand 50.

In summary, referring to FIGS. 1 to 25, the display device 1; 1' may include the head 60 including the display panel 10; 10', the stand 50 which supports the head 60, and the moving assembly, which is coupled both to the head 60 and to the stand 50, the moving assembly including the rotational assembly 100 which allows the head to be rotated, and the tilt assembly 200 which allows the head 60 to be inclined with respect to the stand 50, wherein the rotational assembly 100 may include the base 110 and the rotating plate 120 rotatable on the base 110, wherein the tilt assembly 200 may include the holder 210 fixed to the stand 50, the rotating body 220, which is fixed to the base 110 and is rotatably coupled to the holder 210, the rotating body having the rotational axis intersecting the rotational axis of the rotating plate 120, and the elastic member 230S, which is disposed between the holder 210 and the rotating body 220 and is fixed at one end thereof to the holder 210, and wherein the rotating body 220 may be supported by the elastic member 230S at a position adjacent to the other end 230Sb of the elastic member.

The rotating plate 120 may be fixed to the head at the rear side of the head 60, the holder 210 may be positioned behind the base 110, and the rotating body 220 may be positioned between the base 110 and the holder 210.

The display device may further include the rod 230, which extends in the lateral direction and serves as the rotational axis of the rotating body 220, the holder 210 may include the body 210a fixed to the stand 50, the first wing 210b, which is bent forwards from the body 210a, and the second wing 210c, which is bent forwards from the body and is spaced apart from the first wing 210b in the lateral direction, and the rod 230 may extend through the first wing 210b and the second wing 210c.

The rotating body 220 may include the plate 221 fixed to the base 110, and the connector 222, which is fixed to the plate 221 at the rear side of the plate 221 and is rotatably coupled both to the first wing 210b and the second wing 210c.

The connector 222 may include the first part 222a fixed to the plate 221, a second part 222b, which is bent rearwards from the first part 222a and is in contact with the first wing 210b, the third part 222c, which is bent rearwards from the first part 222a and is in contact with the second wing 210c, and the fourth part 222d, which is bent rearwards from the first part 222a and is positioned between the second part 222b and the third part 222c, and the rod 230 may extend through the second part 222b and the third part 222c.

The other end 230Sb of the elastic member 230S may be a free end, and the fourth part 222d may include the recess 222d1, which is depressed forwards from the rear side of the fourth part 222d and is supported by the elastic member 230S at a position adjacent to the free end.

The elastic member 230S may include the plurality of elastic members 230S1, 230S2 and 230S3, which are spaced apart from each other in the lateral direction, and at least one of the plurality of elastic members 230S1, 230S2 and 230S3 may be supported by the fourth part 222d at the right or left end of the recess 222d1.

The display device may further include the sleeve 231 surrounding the outer circumferential surface of the rod 230, and the elastic member 230S may be provided as a spring, and may be wound around the outer circumferential surface of the sleeve 231.

The display device may further include the bracket 51, which is disposed between the body 210a and the stand 50 and is coupled thereto, and the second part 222b and the third part 222c may be spaced forwards apart from the bracket 51 by a predetermined distance g.

The outer surface of the first wing 210b may be in contact with the inner surface of the second part 222b, the connector 222 may further include the engagement recess 222e, which is depressed upwards from the lower side of the second part 222b, the holder 210 may further include the stopper 210e projecting outwards from the outer surface of the first wing 210b, and the engagement recess 222e may be spaced apart from the stopper 210e and may surround a portion of the stopper 210e.

The stopper 210e may be positioned on the rotational orbit of the engagement recess 222e so as to limit the rotation of the engagement recess 222e.

The rotational assembly 100 may further include the guide slot 124, which is formed in the rotating plate 120 so as to define an arc relative to the rotational axis of the rotating plate 120, and a slot pin 118, which is formed on the base 110 and is disposed in the guide slot 124.

The rotating plate 120 may be configured to have a disc shape, and may include the drive gear 122 formed in the outer circumferential surface thereof, the guide slot 124 may include the first guide slot 124, which is positioned opposite the drive gear 122 with respect to the rotational center of the rotating plate 120 and is formed through the rotating plate 120, and the slot pin 118 may include a first slot pin 118, which projects from the base 110 and is disposed in the first guide slot 124.

The guide slot may further include the second guide slot 128, which is positioned opposite the first guide slot 124 with respect to the rotational center of the rotating plate 120 and is positioned adjacent to the drive gear 122, and the slot pin may further include the second slot pin 117, which projects from the base 110 and is disposed in the second guide slot 128.

The arc defined by the drive gear 122 may at least partially overlap the arc defined by the second guide slot 128.

The effects of the display device according to the present disclosure will be described.

At least one embodiment of the present disclosure provides a rotating structure for a display device.

At least one embodiment of the present disclosure provides a tilting structure for a display device.

At least one embodiment of the present disclosure provides a structure capable of independently realizing rotation and tilting of a display device.

Certain embodiments or other embodiments of the disclosure described above are not mutually exclusive or distinct from each other. Any or all elements of the embodiments of the disclosure described above may be combined with each other in configuration or function.

For example, a configuration "A" described in one embodiment of the disclosure and the drawings and a configuration "B" described in another embodiment of the disclosure and the drawings may be combined with each other. That is, even if the combination of the configurations is not explicitly described, the combination is possible except in the case where it is stated that the combination is impossible.

Although embodiments have been described with reference to a number of illustrative embodiments thereof, it should be understood that numerous other modifications and embodiments that fall within the scope of the principles of this disclosure can be devised by those skilled in the art. More particularly, various variations and modifications are possible in the component parts and/or arrangements within the scope of the disclosure, the drawings and the appended claims. In addition to variations and modifications in the component parts and/or arrangements, alternative uses will also be apparent to those skilled in the art.

What is claimed is:

1. A display device comprising:
   a head comprising a display panel;
   a stand supporting the head; and
   a moving assembly coupled to the head and to the stand, wherein the moving assembly comprises a rotational assembly for rotating the head with respect to the stand and a tilt assembly for allowing the head to be inclined with respect to the stand,
   wherein the rotational assembly comprises:
   a base; and
   a rotating plate rotatably disposed at the base about a first rotational axis,
   wherein the tilt assembly comprises:
   a holder fixed to the stand;
   a rotating body coupled to the base and rotatably coupled to the holder about a second rotational axis, wherein the first rotational axis intersects the second rotational axis;
   a rod providing the second rotational axis and passing through portions of the holder and the rotating body overlapping each other in a direction of the second rotational axis; and
   a spring wound around an outer circumferential surface of the rod between the holder and the rotating body, wherein a first end of the spring is coupled to the holder, and
   wherein the rotating body comprises a protrusion protruding toward a point adjacent to a second end of the spring opposite to the first end from another portion of the rotating body next to the portion of the rotating body overlapping the holder, and supported by the spring.

2. The display device according to claim 1, wherein the rotating plate is coupled to the head at a rear side of the head, wherein the holder is positioned behind the base, and wherein the rotating body is positioned between the base and the holder.

3. The display device according to claim 1, wherein the rod extends in a lateral direction,
   wherein the holder comprises:
   a body coupled to the stand;
   a first wing angled in a forward direction from the body; and
   a second wing bent in the forward direction from the body, wherein the second wing is spaced apart from the first wing with respect to the lateral direction, and
   wherein the rod extends through the first wing and the second wing.

4. The display device according to claim 3, wherein the rotating body comprises:
   a plate coupled to the base; and
   a connector coupled to the plate at a rear side of the plate, wherein the connector is rotatably coupled to the first wing and the second wing.

5. The display device according to claim 4, wherein the connector comprises:
   a first part coupled to the plate;
   a second part bent in a backward direction from the first part to contact the first wing;
   a third part bent in the backward direction from the first part to contact the second wing; and
   a fourth part bent in the backward direction from the first part and to be positioned between the second part and the third part,
   wherein the fourth part defines the protrusion, and
   wherein the rod extends through the second part and the third part.

6. The display device according to claim 5, wherein the second end of the spring corresponds to an unobstructed end; and
   wherein the fourth part comprises a recess depressed in a forward direction from a rear side of the fourth part and is supported by the spring at a position adjacent to the unobstructed end.

7. The display device according to claim 6, wherein the spring comprises a plurality of springs each spaced apart from each other in the lateral direction, and
   wherein at least one of the plurality of springs is supported by the fourth part at a right end or left end of the recess.

8. The display device according to claim 5, further comprising a sleeve around the outer circumferential surface of the rod,
   wherein the spring is wound around an outer circumferential surface of the sleeve.

9. The display device according to claim 5, further comprising a bracket coupled to the body and the stand,
   wherein the second part and the third part are spaced apart in the forward direction from the bracket by a determined distance.

10. The display device according to claim 5, wherein an outer surface of the first wing is in contact with an inner surface of the second part,
    wherein the connector further comprises an engagement recess depressed in an upward direction from a lower side of the second part,
    wherein the holder further comprises a stopper projecting outwards from the outer surface of the first wing, and
    wherein the engagement recess is spaced apart from the stopper and surrounds a portion of the stopper.

11. The display device according to claim 10, wherein the stopper is positioned on a rotational path of the engagement recess and limits a rotation of the engagement recess and the connector.

12. The display device according to claim 1, wherein the rotational assembly further comprises:
    a guide slot formed in the rotating plate for defining an arc relative to the first rotational axis of the rotating plate; and
    a slot pin formed on the base and is disposed in the guide slot.

13. The display device according to claim 12, wherein the rotating plate is configured to have a disc shape and comprises a drive gear formed along an outer circumferential surface of the rotating plate, wherein the guide slot comprises a first guide slot positioned opposite to the drive gear with respect to a rotational center of the rotating plate and is formed through the rotating plate; and the slot pin comprises a first slot pin projecting from the base and disposed in the first guide slot.

14. The display device according to claim 13, wherein the guide slot further comprises a second guide slot positioned opposite to the first guide slot with respect to the rotational center of the rotating plate and positioned adjacent to the drive gear, and wherein the slot pin further comprises a second slot pin projecting from the base and disposed in the second guide slot.

15. The display device according to claim 14, wherein an arc defined by the drive gear at least partially overlaps an arc defined by the second guide slot.

* * * * *